(12) United States Patent
Tsuchida et al.

(10) Patent No.: US 8,305,090 B2
(45) Date of Patent: Nov. 6, 2012

(54) CAPACITANCE TOUCH SENSING DEVICE AND DOOR LOCKING DEVICE

(75) Inventors: Tamotsu Tsuchida, Toyota (JP); Arinobu Kimura, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 272 days.

(21) Appl. No.: 12/743,996

(22) PCT Filed: Nov. 17, 2008

(86) PCT No.: PCT/IB2008/003404
§ 371 (c)(1),
(2), (4) Date: May 20, 2010

(87) PCT Pub. No.: WO2009/068991
PCT Pub. Date: Jun. 4, 2009

(65) Prior Publication Data
US 2010/0264940 A1  Oct. 21, 2010

(30) Foreign Application Priority Data

Nov. 30, 2007 (JP) ................................. 2007-311336
Nov. 30, 2007 (JP) ................................. 2007-311337

(51) Int. Cl.
*G01R 27/26* (2006.01)
*G06F 3/045* (2006.01)
*G08B 13/08* (2006.01)

(52) U.S. Cl. ...... 324/663; 324/658; 345/174; 340/545.1
(58) Field of Classification Search .......... 324/658–690; 345/173, 174; 340/545.1
See application file for complete search history.

(56) References Cited

U.S. PATENT DOCUMENTS

| 7,205,777 | B2 * | 4/2007 | Schulz et al. ................. 324/661 |
| 2002/0125994 | A1 * | 9/2002 | Sandau et al. ............... 340/5.62 |
| 2007/0018790 | A1 * | 1/2007 | LaFrance ..................... 340/5.72 |
| 2007/0024420 | A1 | 2/2007 | Watanabe et al. |
| 2008/0157704 | A1 * | 7/2008 | Ishikawa ....................... 318/483 |

FOREIGN PATENT DOCUMENTS
CN          1579849 A       2/2005
(Continued)

OTHER PUBLICATIONS

International Search Report issued in International Patent Application No. PCT/IB2008/003404 on May 4, 2009.
Written Opinion of the International Searching Authority issued in International Patent Application No. PCT/IB2008/003404 on May 4, 2009.

(Continued)

*Primary Examiner* — Melissa Koval
*Assistant Examiner* — Farhana Hoque
(74) *Attorney, Agent, or Firm* — Oliff & Berridge, PLC

(57) ABSTRACT

A capacitance touch sensing device that detects the touch of a user against a surface of a door handle on the outside of a vehicle includes an upper sensor electrode provided in an upper portion of the door handle, a lower sensor electrode provided in a lower portion of the door handle, an upper detecting portion that detects when the user has touched an upper surface of the door handle based on output from the upper sensor electrode, and a lower detecting portion that detects when the user has touched a lower surface of the door handle based on output from the lower sensor electrode. The detection sensitivity of one of the upper detecting portion or the lower detecting portion is lower than the detection sensitivity of the other.

16 Claims, 27 Drawing Sheets

FOREIGN PATENT DOCUMENTS

| | | |
|---|---|---|
| DE | 10 2005 041 551 A1 | 3/2007 |
| EP | 0 175 362 A2 | 3/1986 |
| EP | 1 450 489 A1 | 8/2004 |
| EP | 1 505 734 A2 | 2/2005 |
| JP | A-2001-152716 | 6/2001 |
| JP | A-2004-27559 | 1/2004 |
| JP | A-2005-139634 | 6/2005 |
| JP | A-2006-344554 | 12/2006 |
| JP | A-2007-39920 | 2/2007 |
| JP | A-2007-247219 | 9/2007 |
| KR | 10-2007-0099515 A | 10/2007 |
| WO | WO 2004/063504 A1 | 7/2004 |

OTHER PUBLICATIONS

International Preliminary Report on Patentability issued in International Application No. PCT/IB2008/003404 on Mar. 2, 2010.

Japanese Office Action issued in Japanese Patent Application No. 2007-311336 on Sep. 15, 2009 (with translation).

Chinese Office Action dated May 24, 2012 for Chinese Patent Application No. 200880118610.4 (with translation).

Korean Office Action dated Jun. 22, 2011 from Korean Patent Application No. 2010-7011895 (with translation).

* cited by examiner

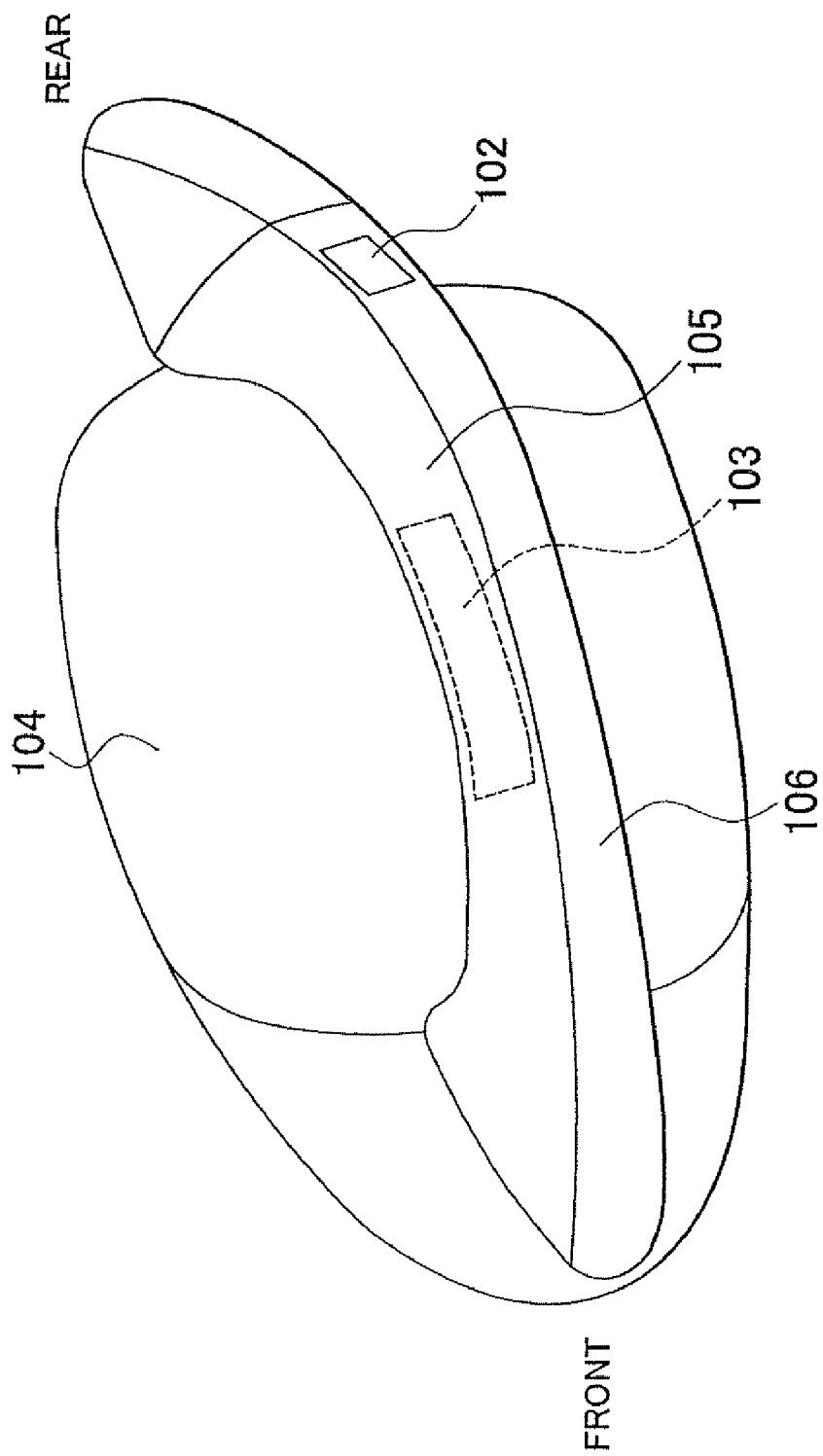

CAPACITANCE TOUCH SENSING DEVICE AND DOOR LOCKING DEVICE

BACKGROUND OF THE INVENTION

1. Field of the Invention

The invention relates to a capacitance touch sensing device. More particularly, the invention relates to a capacitance touch sensing device that can inhibit a erroneous detection that a user has touched a door handle when rainwater has accumulated on the upper surface or the like of the door handle in a vehicle provided with a keyless entry system. The invention also relates to a door locking device. More particularly, the invention relates to a door locking device that can reliably lock or unlock a door even when there is ice or snow on the top surface of a door handle in a vehicle provided with a keyless entry system.

2. Description of the Related Art

In the following description, the terms upper, lower, front, and rear refer to directions with respect to a vehicle. A door handle according to related art in a vehicle provided with a keyless entry system will now be described with reference to drawings. FIG. 26 is a perspective view of an example of a door handle according to related art, in which a lock sensor electrode of a capacitance touch sensor is provided on an upper portion of a door handle. FIG. 27 is a perspective view of an example of another door handle according to related art, in which a lock sensor electrode is provided on a side portion of a door handle.

The number of vehicles with keyless entry systems whereby a door of an automobile can be locked and unlocked without using a key has increased in recent years. Keyless entry systems include an authenticating portion provided inside the vehicle, a portable device that is carried by a user, a capacitance touch sensor which is provided in a door, handle 100 (see FIG. 26) outside the vehicle and detects when a user touches the door handle, a locking portion that locks the door, and an unlocking portion that unlocks the door. Reference numeral 104 in FIG. 26 denotes a recessed portion formed in the door panel outer surface.

The capacitance touch sensor shown in FIG. 26 includes a lock sensor electrode 101, an unlock sensor electrode 103, a driving portion (not shown), and a detecting portion (also not shown). The driving portion drives the touch sensor. The detecting portion detects when a user touches (i.e., contacts) the door handle to lock the door based on a signal from the lock sensor electrode 101, as well as detects when the user has touched the door handle to unlock the door based on a signal from the unlock sensor electrode 103. The lock sensor electrode 101 is housed in an upper portion of the door handle 100. Alternatively, as shown in FIG. 27, the lock sensor electrode 102 is housed in a backside portion (i.e., the portion that faces outward away from the vehicle) of the door handle 106. Also, as shown in FIGS. 26 and 27, the unlock sensor electrode 103 is housed in a front-side portion (i.e., the portion that faces inward toward the vehicle) of a handle portion 105 of the door handle 100 or 106.

The operation of this system will now be described. First, an unlock operation will be described with reference to FIG. 26. When the user carrying the portable device approaches the vehicle, the authenticating portion communicates with the portable device to authenticate the user. If the authenticating portion recognizes the user as a legitimate user and the capacitance touch sensor detects when the user has touched the backside surface of the handle portion 105 when the user then grabs the handle portion 105 of the door handle 100, the unlocking portion unlocks the door.

Next, a lock operation when the lock sensor electrode 101 is provided on the upper portion of the door handle 100 will be described with reference to FIG. 26. When the user carrying the portable device gets out of the vehicle, the authenticating portion communicates with the portable device to authenticate the user. If the authenticating portion recognizes the user as a legitimate user and the capacitance touch sensor detects when the user has touched the upper surface of the door handle 100 after the user has closed the door, the locking portion locks the door.

Next, a lock operation when the lock sensor electrode 102 is provided on the front-side portion of the door handle 106 will be described with reference to FIG. 27. When the user carrying the portable device gets out of the vehicle, the authenticating portion communicates with the portable device to authenticate the user. If the authenticating portion recognizes the user as a legitimate user and the capacitance touch sensor detects when the user has touched the front-side surface of the door handle 106 after the user has closed the door, the locking portion locks the door.

In this way, the keyless entry system enables the user to lock and unlock the door simply by touching the door handle 100 or 106 without performing a key operation, thereby making it easier to lock and unlock the door.

However, the keyless entry system described above has the following problems. First, a problem that arises when the lock sensor electrode 101 is provided on the upper portion of the door handle 100 will be described with reference to FIG. 26. When it rains, rainwater may collect on the upper surface of the door handle 100 and that rainwater may freeze. If rainwater freezes on the upper surface of the door handle 100, it may prevent the user from being able to directly touch (contact) the upper portion of the door handle 100 so the locking portion is unable to lock the door.

Also, if rainwater collects on the upper surface of the door handle 100 as described above, the floating capacitance of the rainwater may increase the capacitance near the lock sensor electrode 101 and the detecting portion may erroneously detect the user touching the upper surface of the door handle 100. If this happens, the door may end up locking against the intention of the user, even though the user did not touch the door handle 100.

A door touch sensor described in Japanese Patent Application Publication No. 2005-139634 (JP-A-2005-139634) has a lock sensor electrode provided in an upper portion of a door handle and therefore may have the same problem as that of the structure shown in FIG. 26.

Next, a problem that arises when the lock sensor electrode 102 is provided on the side portion of the door handle 106 will be described with reference to FIG. 27. In this case, when the user closes the door, the locking portion may lock the door as a result of a finger or a handbag touching the front-side surface of the door handle 106 even if the user has no intention of locking the door.

A door touch sensor described in Japanese Patent Application Publication No. 2006-344554 (JP-A-2006-344554) has a lock sensor electrode provided on a front-side portion of a door handle and thus may have the same problem as that of the structure shown in FIG. 27.

SUMMARY OF THE INVENTION

This invention thus provides a capacitance touch sensing device capable of inhibiting an erroneous detection that a user has touched a door handle when rainwater has collected on an upper surface or the like of the door handle in a vehicle provided with a keyless entry system.

The invention also provides a door locking device capable of reliably locking or unlocking a door even if there is ice or snow on an upper surface of a door handle.

A first aspect of the invention relates to a capacitance touch sensing device. This capacitance touch sensing device includes an upper sensor electrode provided on an upper portion of the door handle, a lower sensor electrode provided on a lower portion of the door handle, an upper detecting portion that detects when the user has touched an upper surface of the door handle based on output from the upper sensor electrode, and a lower detecting portion that detects when the user has touched a lower surface of the door handle based on output from the lower sensor electrode. A detection sensitivity of one of the upper detecting portion or the lower detecting portion is lower than the detection sensitivity of the other.

According to the structures described above, the detection sensitivity of the upper detecting portion is set lower than the detection sensitivity of the lower detecting portion when there is a possibility of rainwater collecting on the upper surface of the door handle, which enables the touch of the user to be detected with high sensitivity by the lower detecting portion while inhibiting erroneous touch (i.e., contact by the user) detection by the upper detecting portion. Also, the detection sensitivity of the lower detecting portion is set lower than the detection sensitivity of the upper detecting portion when there is a possibility of rainwater collecting on the lower surface of the door handle so the detection sensitivity of the upper detecting portion is high and the detection sensitivity of the lower detecting portion is low. As a result, the touch of the user can be detected with high sensitivity by the upper detecting portion while erroneous touch detection by the lower detecting portion is inhibited. How easily rainwater tends to collect on the upper or lower surface of the door handle depends on the surface shape of the door handle and the shape of the door panel to which the door handle is attached, and the like. Also, providing the upper detecting portion and the lower detecting portion enables the door handle to be vertically symmetrical, with the upper and lower portions having the same shape and function. As a result, the same parts can be used in the door handles of both the left and right doors of the vehicle, which enables the manufacturing cost of the door handle to be reduced.

In the capacitance touch sensing device according to the first aspect, the detection sensitivity of the upper detecting portion may be lower than the detection sensitivity of the lower detecting portion.

The capacitance touch sensing device according to the first aspect may also include rain detecting means for detecting rain, and a controlling portion which, when the rain detecting means detects rain, reduces the detection sensitivity of one of the upper detecting portion or the lower detecting portion so as to be lower than the detection sensitivity of the other.

According to the structure described above, when rainwater has collected on the upper surface of the door handle, the detection sensitivity of the upper detecting portion is reduced so that it is lower than the detection sensitivity of the lower detecting portion. Accordingly, the detection sensitivity of the lower detecting portion is high and the detection sensitivity of the upper detecting portion is low. As a result, the touch of the user can be detected with high sensitivity by the low detecting portion while erroneous touch detection by the upper detecting portion is inhibited. Also, when rainwater has collected on the lower surface of the door handle, the detection sensitivity of the lower detecting portion is reduced so that it is lower than the detection sensitivity of the upper detecting portion. Accordingly, the detection sensitivity of the upper detecting portion is high and the detection sensitivity of the lower detecting portion is low.

As a result, the touch of the user can be detected with high sensitivity by the upper detecting portion while erroneous touch detection by the lower detecting portion can be inhibited.

In the capacitance touch sensing device described above, when the rain detecting means detects rain, the controlling portion may reduce the detection sensitivity of the upper detecting portion so as to be lower than the detection sensitivity of the lower detecting portion.

In the capacitance touch sensing device described above, the rain detecting means may be a water droplet detection sensor that detects an amount of water droplets on a vehicle body.

According to this structure, the detection sensitivity of the upper detecting portion or the lower detecting portion can be changed appropriately based on the amount of water droplets on the vehicle body.

In the capacitance touch sensing device described above, the controlling portion may change the amount by which the detection sensitivity is reduced according to the amount of water droplets on the vehicle body.

According to this structure, the detection sensitivity of the upper detecting portion or the lower detecting portion can be set to a detection sensitivity that is appropriate for the amount of water droplets.

In the capacitance touch sensing device described above, the controlling portion may gradually increase the amount by which the detection sensitivity is reduced as the amount of water droplets on the vehicle body increases.

According to this structure, the detection sensitivity of the upper detecting portion or the lower detecting portion can be set to a detection sensitivity that is appropriate for the amount of increase in water droplets.

In the capacitance touch sensing device described above, the rain detecting means may detect rain based on operation of a wiper.

According to this structure, the detection sensitivity of the upper detecting portion or the lower detecting portion can be changed appropriately based on the operation of the wiper.

In the capacitance touch sensing device described above, the controlling portion may change the amount by which the detection sensitivity is reduced according to the operating state of the wiper.

Accordingly, the detection sensitivity of the upper detecting portion or the lower detecting portion can be set to a detection sensitivity that is appropriate according to the operating state of the wiper.

In the capacitance touch sensing device described above, the controlling portion may gradually increase the amount by which the detection sensitivity is reduced as the operation of the wiper becomes faster.

According to this structure, the detection sensitivity of the upper detecting portion or the lower detecting portion can be set to a detection sensitivity appropriate according to the operating speed of the wiper because the wiper normally operates faster as the amount of rain increases.

In the capacitance touch sensing device described above, the controlling portion may set the detection sensitivity of one of the upper detecting portion or the lower detecting portion to zero when the rain detecting means detects rain.

According to this structure, the upper detecting portion will not detect contact when rainwater has collected on the upper surface of the door handle. As a result, the touch of the user can be detected with high sensitivity by the lower detecting portion while erroneous touch detection by the upper detecting portion can be inhibited. Also, the lower detecting portion will not detect contact when rainwater has collected on the lower surface of the door handle. As a result, the touch of the user can be detected with high sensitivity by the upper detecting portion while erroneous touch detection by the lower detecting portion can be inhibited.

In the capacitance touch sensing device described above, the controlling portion may set the detection sensitivity of the upper detecting portion to zero when the rain detecting means detects rain.

In the capacitance touch sensing device described above, the upper portion of the door handle may be an upper portion in the vertical direction when the door handle is attached to the vehicle, and the lower portion of the door handle may be a lower portion in the vertical direction when the door handle is attached to the vehicle.

A second aspect of the invention relates to a capacitance touch sensing device that detects the touch of a user against a surface of a door handle on the outside of a vehicle. The capacitance touch sensing device detects when the user touches at least one of a plurality of portions on the surface of the door handle which are facing in different directions.

In the capacitance touch sensing device according to the second aspect, the plurality of portions on the surface of the door handle which are facing in different directions may include a portion of an upper surface of the door handle and a portion of a lower surface of the door handle.

The capacitance touch sensing device described above, may also include a sensor electrode which is provided on a front portion of the door handle.

According to this structure, the sensor electrode is provided in the front portion of the door handle so if the thumb of the user accidentally touches the lock sensor electrode when the user grabs the handle portion of the door handle in attempt to unlock the door, that contact will not be detected. This is because it is usual for a person to open and close the right side door with his or her right hand, in which case the thumb of the user when opening and closing the door will be near the rear portion of the door handle, and it is usual for a person to open and close the left side door with his or her left hand, in which case the thumb of the user when opening and closing the door will be also near the rear portion of the door handle. Accordingly, when the capacitance touch sensing device is provide on a door locking device, it makes possible to inhibit the user from unintentionally locking the door.

A third aspect of the invention relates to a door locking device which locks and unlocks a door in response to the touch of a user against a surface of a door handle on the outside of a vehicle. This door locking device includes an authenticating portion which communicates with a portable device carried by the user to authenticate the user outside the vehicle, a capacitance touch sensing device that detects when the user touches at least one of a plurality of portions on the surface of the door handle which are facing in different directions, and a locking portion which locks or unlocks the door when the authenticating portion recognizes the user as a legitimate user and the capacitance touch sensing device detects the touch of the user.

According to this structure, the capacitance touch sensing device detects when the user has touched at least one of the upper surface or the lower surface of the door handle. Accordingly, even if there is ice or snow on the upper door handle, the door can still be reliably locked by the user touching the lower surface of the door handle. Also, providing the capacitance touch sensing device that detects when the user has touched at least one of the upper or lower surfaces of the door handle enables the same parts to be used in the door handles of both the left and right doors of the vehicle.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein:

FIG. 27 is a perspective view of another example of a capacitance touch sensing device and a door locking/unlocking device according to related art.

DETAILED DESCRIPTION OF EMBODIMENTS

A capacitance touch sensing device according to a first example embodiment of the invention will now be described with reference to the drawings. Incidentally, the capacitance touch sensing device according to the invention is mainly used for locking. Accordingly, in the described below, the capacitance touch sensing device according to the first example embodiment is a capacitance touch sensing device for locking so a description of a capacitance touch sensing device for unlocking will be omitted.

Figure 1:
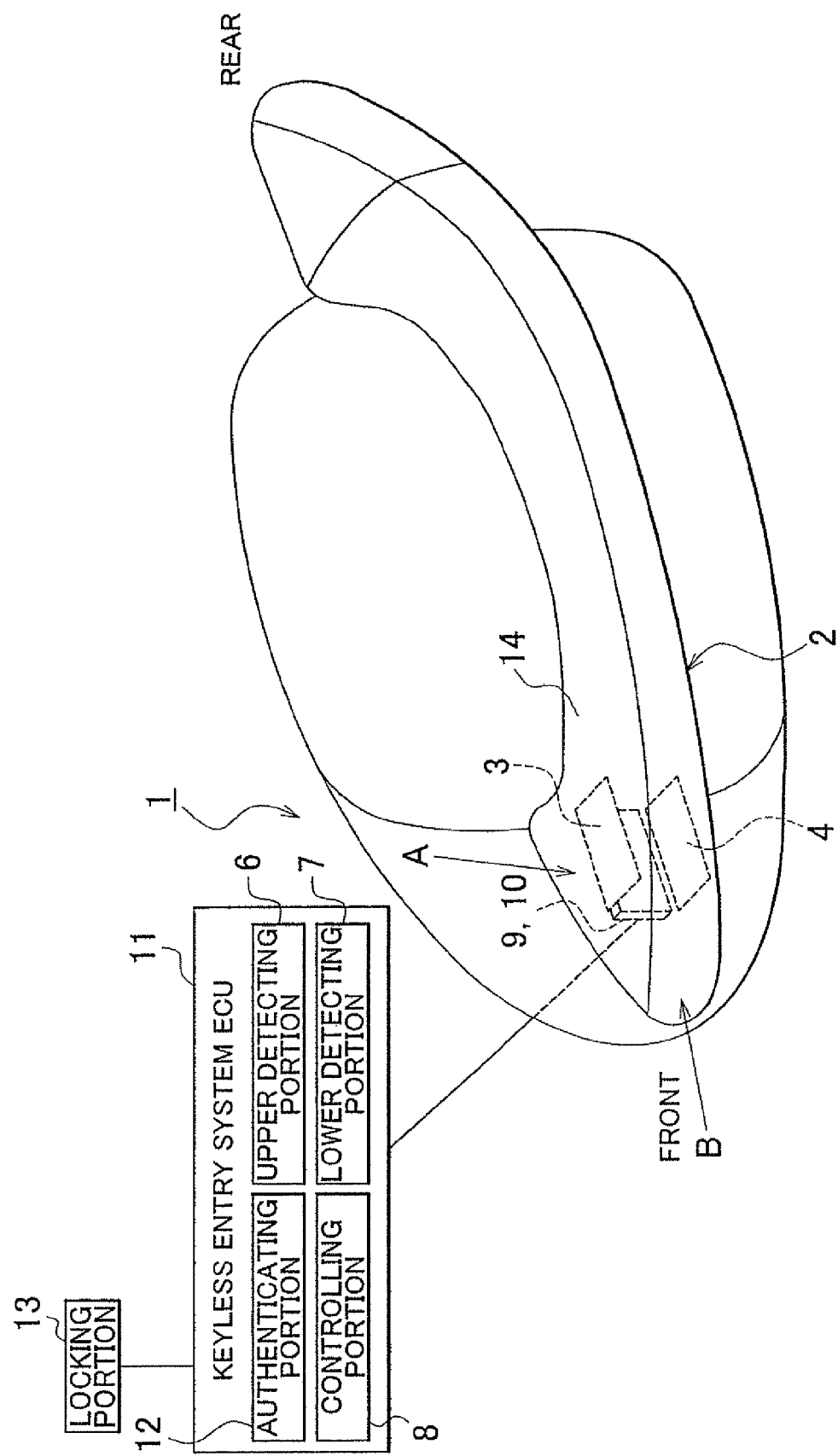
FIG. 1 is a perspective view of a door handle provided with a capacitance touch sensing device according to a first example embodiment of the invention.
Figure 2:
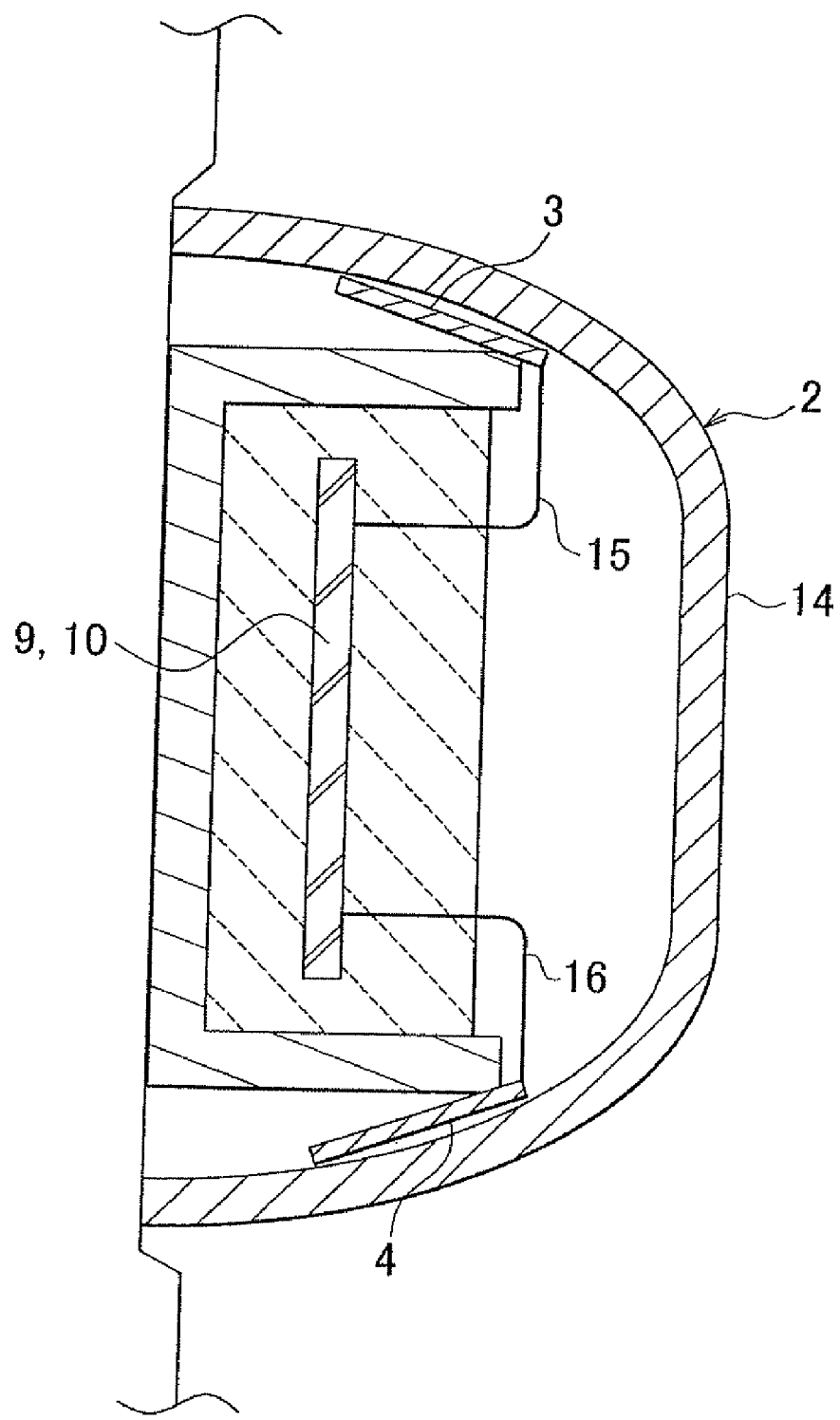
FIG. 2 is a sectional view, as viewed from the direction of arrow II', of a cross section of a portion of the door handle in FIG. 1 indicated by arrow II, which has been cut in a direction orthogonal to the direction of arrow II'.

FIG. 1 is a perspective view of a door handle provided with a capacitance touch sensing device according to a first example embodiment of the invention. FIG. 2 is a sectional view, as viewed from the direction of arrow II', of a portion of the door handle in FIG. 1 indicated by arrow II, which has been cut in a direction orthogonal to the direction of arrow II'.

A capacitance touch sensing device 1 is one constituent element of a door locking device in a smart entry system. The door locking device locks a door when a user touches an upper surface of a door handle 2 on the outside of the vehicle. The door locking device includes an authenticating portion 12, the capacitance touch sensing device 1, and a locking portion 13.

The authenticating portion 12 communicates with a portable device, not shown, carried by the user to authenticate the user outside the vehicle. The user is authenticated (i.e., recognized) by matching a user ID stored in the portable device with a user ID stored in the authenticating portion 12. The authenticating portion 12 is provided in a keyless entry system ECU 11. The authenticating portion 12 communicates with the portable device via a transmitting antenna (not shown) which is provided in the door handle 2, and a receiving antenna (also not shown).

The locking portion 13 locks the door when the authenticating portion 12 recognizes the user as a legitimate user and the capacitance touch sensing device 1 used for locking detects when the user has touched the upper front surface of the door handle 2.

The capacitance touch sensing device 1 is a capacitance touch sensing device that detects when a user touches the front surface of the door handle 2 outside the vehicle. The capacitance touch sensing device 1 detects when the user has touched the door handle 2 based on a change in the capacitance near the sensor electrode when the user (a person) is near the sensor electrode.

The capacitance touch sensing device 1 includes an upper sensor electrode 3, a lower sensor electrode 4, an upper driving portion 9, a lower driving portion 10, an upper detecting portion 6, a lower detecting portion 7, and a controlling portion 8.

The upper sensor electrode 3 is provided in a case 14 of the door handle 2 and is located in the front upper portion of the door handle 2. The case 14 is made of synthetic resin. The upper sensor electrode 3 is connected to the upper driving portion 9 via a wire 15, as shown in FIG. 2. When the user touches the front upper portion of the door handle 2, the capacitance near the upper sensor electrode 3 increases. An electrical signal according to whether the user has touched the upper surface of the front portion of the door handle 2 is then output to the upper driving portion 9 based on the change in capacitance.

The lower sensor electrode 4 is positioned in the lower part of the front portion of the door handle 2. The lower sensor electrode 4 is connected to a lower driving portion 10 via a wire 16, as shown in FIG. 2. When the user touches the front lower surface of the door handle 2, the capacitance near the lower sensor electrode 4 increases. An electrical signal according to whether the user has touched the upper surface of the front portion of the door handle 2 is then output to the lower driving portion 10 based on the change in capacitance.

The upper driving portion 9 of the capacitance touch sensing device 1 drives a portion related to detecting contact with the upper surface of the door handle 2, and has a power supply circuit and a resonance circuit, neither of which are shown. The resonance circuit receives voltage from the power supply circuit and changes the amplitude of the output voltage based on an output signal from the upper sensor electrode 3. The change in amplitude indicates whether the user has touched the upper surface of the front portion of the door handle 2. The upper driving portion 9 is provided in the case 14 of the door handle 2.

The lower driving portion 10 in the capacitance touch sensing device 1 drives a portion related to detecting contact with the lower surface of the door handle 2, and also has a power supply circuit and a resonance circuit, neither of which are shown. The resonance circuit receives voltage from the power supply circuit and changes the amplitude of the output voltage based on an output signal from the lower sensor electrode 4. The change in amplitude indicates whether the user has touched the lower surface of the front portion of the door handle 2. The lower driving portion 10 is provided in the case 14 of the door handle 2.

Figure 3:
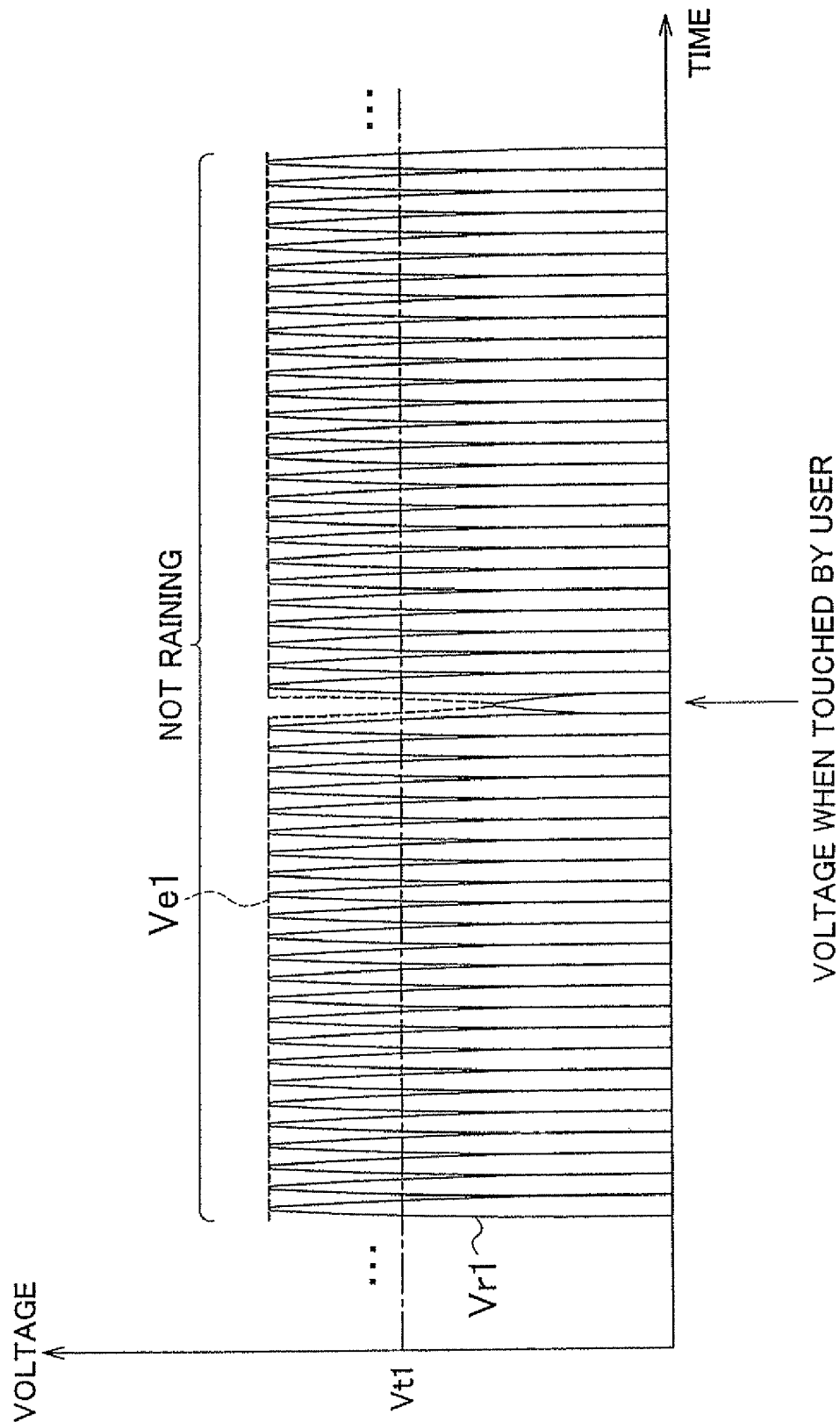
FIG. 3 is a chart showing the manner in which an upper detecting portion processes output voltage of an upper driving portion when it is not raining according to the first example embodiment of the invention.
Figure 4:
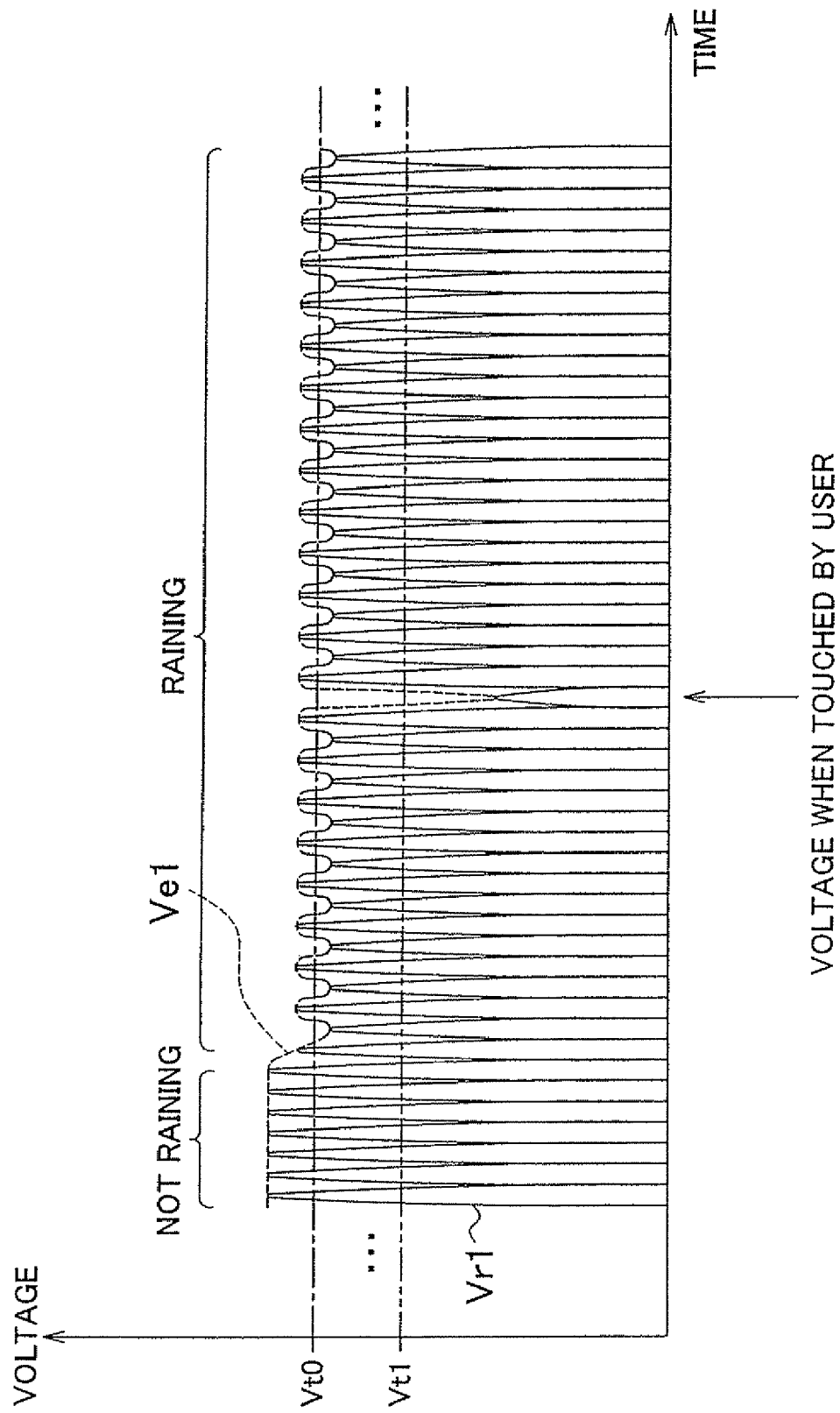
FIG. 4 is a chart showing the manner in which the upper detecting portion processes output voltage of the upper driving portion when it is raining according to the first example embodiment of the invention.

FIG. 3 is a chart showing the manner in which the upper detecting portion 6 processes the output voltage of the upper driving portion 9 when it is not raining, and FIG. 4 is a chart showing the manner in which the upper detecting portion 6 processes output voltage of the upper driving portion when it is raining. The upper detecting portion 6 detects when the user has touched the upper surface of the door handle 2 based on the signal output from the upper driving portion 9. More specifically, for example, the upper detecting portion 6 rectifies AC (alternating-current) voltage output from the upper driving portion 9 to obtain a rectified voltage Vr1 (as shown by the solid line in FIG. 3), and performs envelope detection of that rectified voltage Vr1, as shown in FIG. 3. The upper detecting portion 6 determines that the user has touched the upper surface of the door handle 2 when the value of the voltage Ve1 after envelope detection (as shown by the broken line in FIG. 3) is equal to or less than a threshold voltage Vt1. The upper detecting portion 6 is provided in the keyless entry system ECU 11.

The detection sensitivity of the upper detecting portion 6 is set so that it is always lower than the detection sensitivity of the lower detecting portion 7. The detection sensitivity of the upper detecting portion 6 refers to the sensitivity with which the upper detecting portion 6 detects the user touching the upper surface of the door handle 2. The detection sensitivity of the lower detecting portion 7 refers to the sensitivity with which the lower detecting portion detects the user touching the lower surface of the door handle 2.

Rainwater may tend to collect on the upper or lower surface of the door handle 2 depending on the surface shape of the door handle 2 and the shape of the door panel to which the door handle 2 is attached, and the like. When there is a possibility of rainwater collecting on the upper surface of the door handle 2, the sensitivity of the lower detecting portion 7 can be made high and the sensitivity of the upper detecting portion 6 can be made low by setting the detection sensitivity of the upper detecting portion 6 so that it is always lower than the detection sensitivity of the lower detecting portion 7. As a result, highly sensitive touch detection by the lower detecting portion 7 is made possible while erroneous touch detection by the upper detecting portion 6 can be inhibited.

The detection sensitivities of the upper detecting portion 6 and the lower detecting portion 7 increase as the value of the threshold voltage Vt1 increases, and decrease as the value of the threshold voltage Vt1 decreases. Accordingly, the value of the threshold voltage Vt1 in the upper detecting portion 6 is always set lower than the value of the threshold voltage Vt1 in the lower detecting portion 7.

When the user touches the upper surface of the door handle 2, the voltage Ve1 after envelope detection drops so that it is lower than it is before the user touches the upper surface of the door handle 2, as shown in FIG. 3. Therefore, the upper detecting portion 6 is able to detect when the user has touched the upper surface of the door handle 2 by detecting a decrease in the voltage Ve1. Accordingly, if the value of the threshold voltage Vt1 is increased within the fluctuation range of the voltage Ve1, the detection sensitivity of the upper detecting portion 6 increases. However, when rainwater collects on the upper surface of the door handle 2, the voltage Ve1 drops from what it is before the rainwater collects, as shown in FIG. 4, due to the change in the capacitance. Therefore, if the threshold voltage Vt1 is set too high when it is raining (see Vt0 on the upper side in FIG. 4), it may be erroneously determined that the drop in voltage Ve1 that occurs when rainwater has collected is due to the user touching the door handle 2. Therefore, the threshold voltage Vt1 is set low so that it will not become higher than the voltage Ve1 when rainwater has collected (see FIG. 4). As a result, the upper detecting portion 6 will not erroneously detect rainwater that has collected on the door handle 2 when it is raining as contact with the door handle 2 by the user. Incidentally, the detection sensitivity of the upper detecting portion 6 is low but the detection sensitivity of the lower detecting portion 7 is high so when the user touches the lower surface of the door handle 2, the lower detecting portion 7 can detect that contact with high sensitivity. Incidentally, another method of detection may also be used in this example embodiment.

Figure 5:
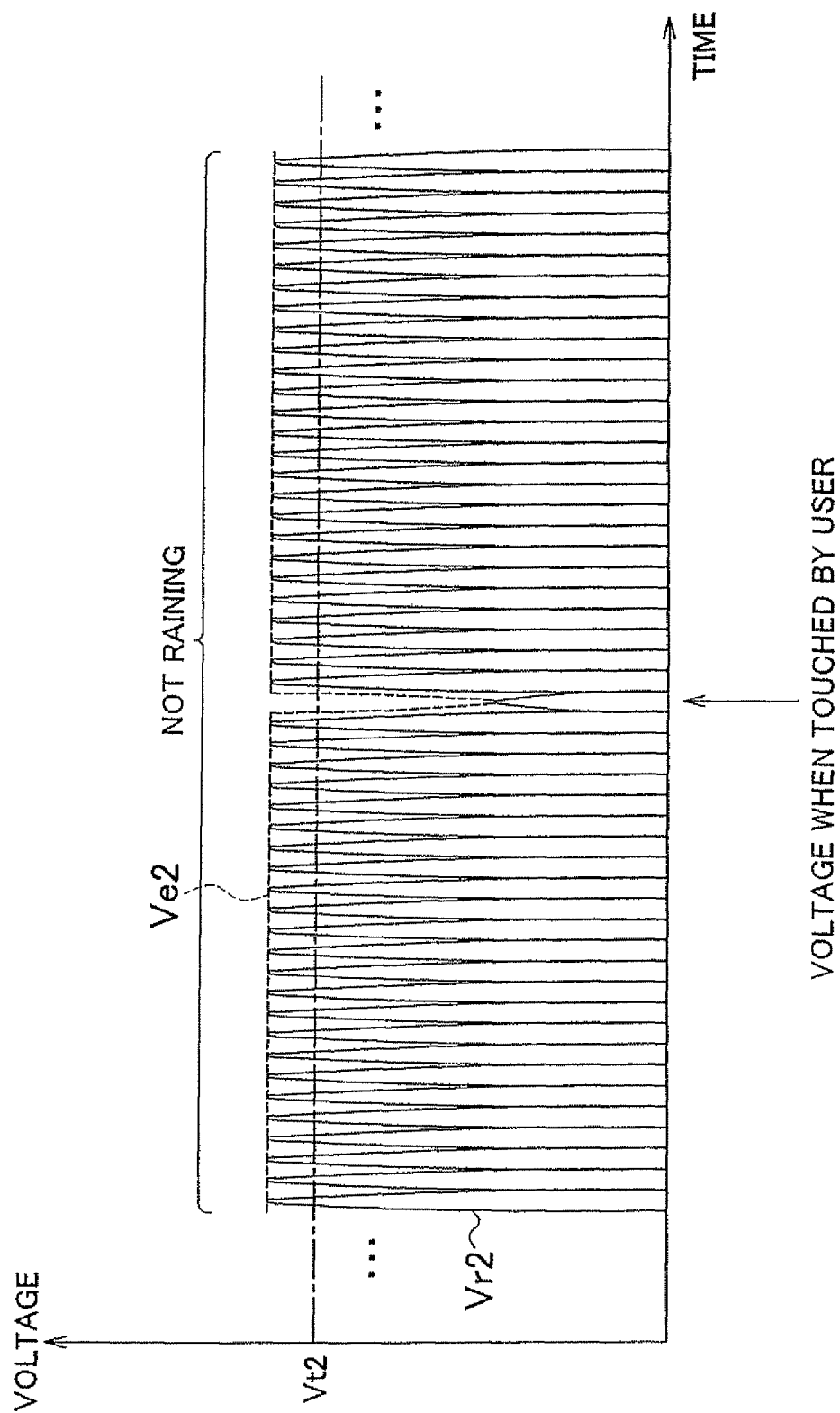
FIG. 5 is a chart showing the manner in which a lower detecting portion processes output voltage of a lower driving portion when it is not raining according to the first example embodiment of the invention.
Figure 6:
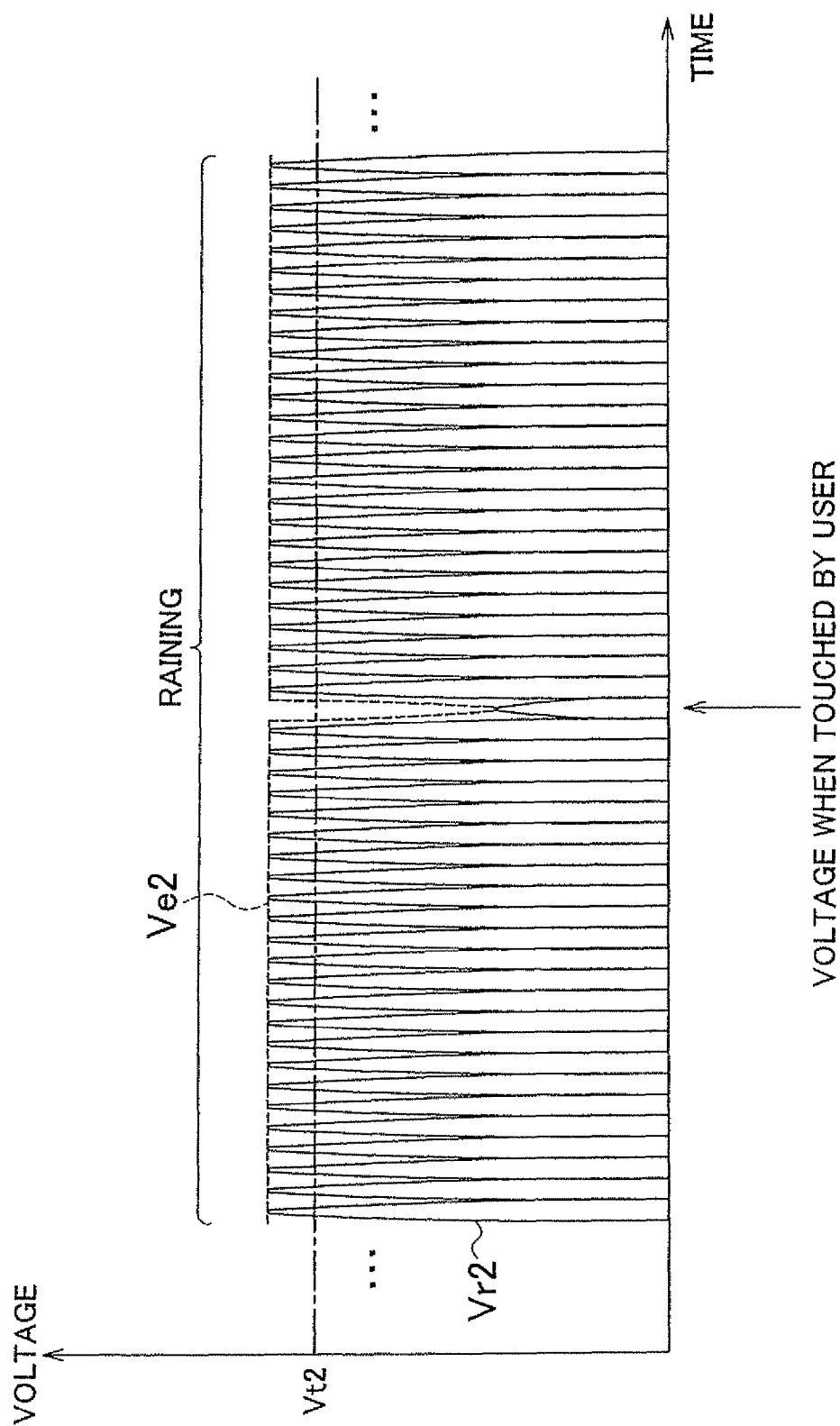
FIG. 6 is a chart showing the manner in which the lower detecting portion processes output voltage of the lower driving portion when it is raining according to the first example embodiment of the invention.

FIG. 5 is a chart showing the manner in which the lower detecting portion 7 processes output voltage of the lower driving portion 10 when it is not raining, and FIG. 6 is a chart showing the manner in which the lower detecting portion 7 processes output voltage of the lower driving portion 10 when it is raining. The lower detecting portion 7 detects when the user has touched the lower surface of the door handle 2 based on the signal output from the lower driving portion 10. More specifically, for example, the lower detecting portion 7 rectifies AC (alternating-current) voltage output from the lower driving portion 10 to obtain a rectified voltage Vr2 (as shown by the solid line in FIG. 5), and performs envelope detection of that rectified voltage Vr2, as shown in FIG. 5. The lower detecting portion 7 determines that the user has touched the lower surface of the door handle 2 when the value of the voltage Ve2 after envelope detection (as shown by the broken line in FIG. 5) is equal to or less than a threshold voltage Vt2. The lower detecting portion 7 is provided in the keyless entry system ECU 11.

The detection sensitivity of the lower detecting portion 7 is always higher than the detection sensitivity of the upper detecting portion 6. That is, the threshold voltage Vt2 of the lower detecting portion 7 is always set to a higher level than the threshold voltage Vt1 of the upper detecting portion 6. When it is unlikely that rainwater will collect on the lower surface of the door handle 2 when it is raining, it is unlikely that there will be an erroneous detection of contact from rainwater collecting even with these settings.

When the user touches the lower surface of the door handle 2, the voltage Ve2 after envelope detection drops from what it is before user touches the lower surface of the door handle 2, as shown in FIG. 5. Accordingly, the lower detecting portion 7 is able to detect when the user has touched the lower surface of the door handle 2 by detecting a decrease in the voltage Ve2. Accordingly, if the value of the threshold voltage Vt2 is increased within the fluctuation range of the voltage Ve2, the detection sensitivity of the lower detecting portion 7 increases. The detection sensitivity of the lower detecting portion 7 can be set to always be high, as shown in FIG. 6, when it is unlikely that rainwater will collect on the lower surface of the door handle 2 even if it is raining. Accordingly, detection sensitivity of the lower detecting portion 7 always remains high so contact with the lower surface of the door handle 2 by the user can be detected with high sensitivity. Incidentally, another method of detection may also be used in this example embodiment.

The controlling portion 8 sets the detection sensitivities of both the upper detecting portion 6 and the lower detecting portion 7, and sets the detection sensitivity of the upper detecting portion 6 so that it is always lower than the detection sensitivity of the lower detecting portion 7.

Next, operation of the capacitance touch sensing device 1 according to the first example embodiment will be described with reference to the drawings. Incidentally, user authentication and locking of the door are not characteristics of this example embodiment so descriptions thereof will be omitted.

Figure 7:
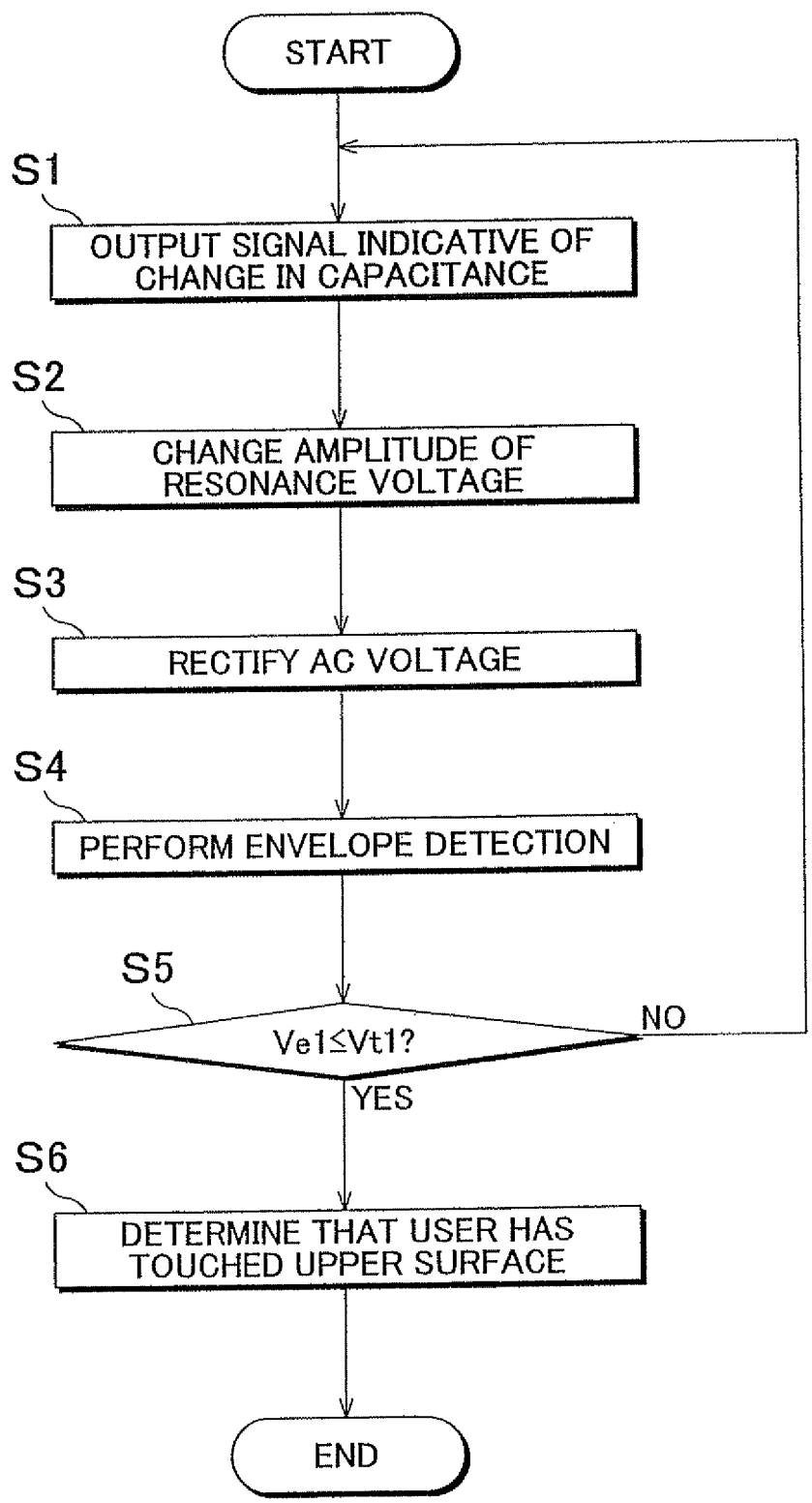
FIG. 7 is a flowchart illustrating an operation to detect contact with the upper surface of the door handle when it is not raining according to the first example embodiment of the invention.

First, an operation to detect contact with the upper surface of the door handle 2 when it is not raining will be described. FIG. 7 is a flowchart illustrating an operation to detect contact with the upper surface of the door handle 2 when it is not raining. When the user touches the upper surface of the front portion of the door handle 2, the capacitance near the upper sensor electrode 3 changes in the capacitance touch sensing device 1. The upper sensor electrode 3 outputs a signal indicative of that change in capacitance to the upper driving portion 9 (step S1). The upper driving portion 9 then changes the amplitude of the output voltage of the resonance circuit based on the signal received from the upper sensor electrode 3 (step S2). This change in amplitude indicates that the user has touched the upper surface of the front portion of the door handle 2.

The upper detecting portion 6 rectifies the AC voltage output by the upper driving portion 9 to obtain the rectified voltage Vr1 (step S3) and performs envelope detection of that rectified voltage Vr1 (step S4). The upper detecting portion 6 then compares the value of the voltage Ve1 after envelope detection with the threshold voltage Vt1 (step S5). If the voltage Ve1 is equal to or less than the threshold voltage Vt1, the upper detecting portion 6 determines that the user has touched the upper surface of the front portion of the door handle 2 (step S6). If, on the other hand, the voltage Ve1 is greater than the threshold voltage Vt1, the upper detecting portion 6 determines that the user has not touched the upper surface of the front portion of the door handle 2 and the process returns to step S1. This is the operation for detecting contact with the upper surface of the door handle 2.

Figure 8:
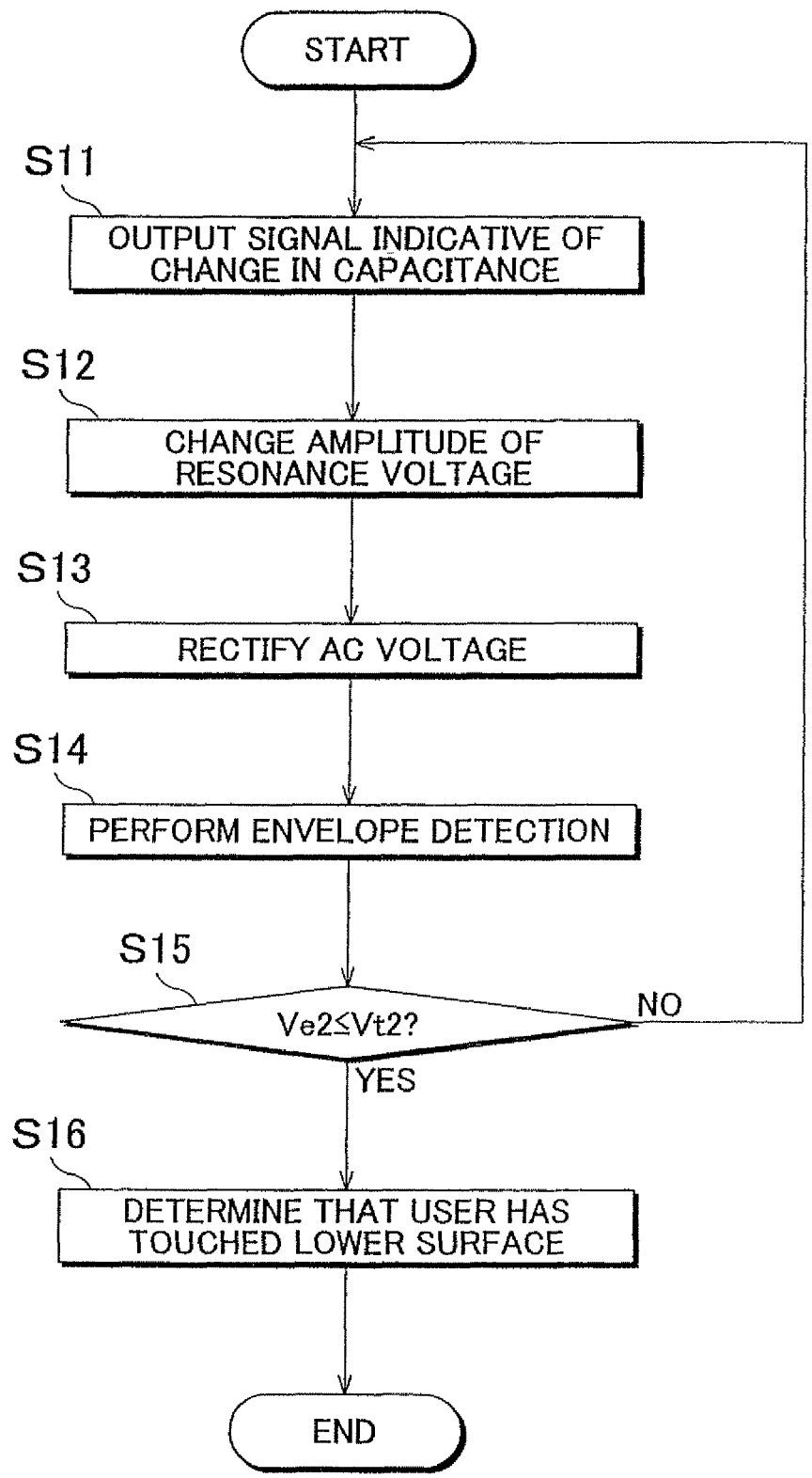
FIG. 8 is a flowchart illustrating an operation to detect contact with the lower surface of the door handle when it is not raining according to the first example embodiment of the invention.

Next, an operation to detect contact with the lower surface of the door handle 2 when it is not raining will be described. FIG. 8 is a flowchart illustrating an operation to detect contact with the lower surface of the door handle 2 when it is not raining. When the user touches the lower surface of the front portion of the door handle 2, the capacitance near the lower sensor electrode 4 changes in the capacitance touch sensing device 1. The lower sensor electrode 4 outputs a signal indicative of that change in capacitance to the lower driving portion 10 (step S11). The lower driving portion 10 then changes the amplitude of the output voltage of the resonance circuit based on the signal received from the lower sensor electrode 4 (step S12). This change in amplitude indicates that the user has touched the lower surface of the front portion of the door handle 2.

The lower detecting portion 7 rectifies the AC voltage output by the lower driving portion 10 to obtain the rectified voltage Vr2 (step S13) and performs envelope detection of that rectified voltage Vr2 (step S14). The lower detecting portion 7 then compares the value of the voltage Ve2 after envelope detection with the threshold voltage Vt2 (which is higher than the threshold voltage Vt1) (step S15). If the voltage Ve2 is equal to or less than the threshold voltage Vt2, the lower detecting portion 7 determines that the user has touched the lower surface of the front portion of the door handle 2 (step S16). If, on the other hand, the voltage Ve2 is greater than the threshold voltage Vt2, the lower detecting portion 7 determines that the user has not touched the lower surface of the front portion of the door handle 2 and the process returns to step S11. This is the operation for detecting contact with the lower surface of the door handle 2.

The operation for detecting contact with the upper surface of the door handle 2 when it is raining is the same as the operation for detecting contact with the upper surface of the door handle 2 when it is not raining so a description thereof will be omitted. Also, the operation for detecting contact with the lower surface of the door handle 2 when it is raining is the same as the operation for detecting contact with the lower surface of the door handle 2 when it is not raining so a description thereof will be omitted.

As described above, according to the first example embodiment, the detection sensitivity of the upper detecting portion 6 is always set lower than the detection sensitivity of the lower detecting portion 7, which makes it possible to detect contact with high sensitivity by the lower detecting portion 7 while inhibiting erroneous touch detection by the upper detecting portion 6. Also, providing the upper detecting portion 6 and the lower detecting portion 7 enables the door handle 2 to be vertically symmetrical, with the upper and lower portions having the same shape and function. As a result, the same parts can be used in the door handles 2 of both the left and right doors of the vehicle, which enables the manufacturing cost of the door handle 2 to be reduced.

In the first example embodiment, the detection sensitivity of the upper detecting portion 6 is set so that it is always lower than the detection sensitivity of the lower detecting portion 7. Conversely, in a second example embodiment, the detection sensitivity of a lower detecting portion, not shown, is set so that it is always lower than the detection sensitivity of an upper detecting portion, also not shown. The other structure of the second example embodiment is the same as that of the first example embodiment.

The second example embodiment enables highly sensitive contact detection by the upper detecting portion while inhibiting erroneous touch detection by the lower detecting portion when rainwater tends to collect on the lower surface of the door handle when it is raining.

Next, a capacitance touch sensing device according to a third example embodiment of the invention will be described with reference to the drawings.

Figure 9:
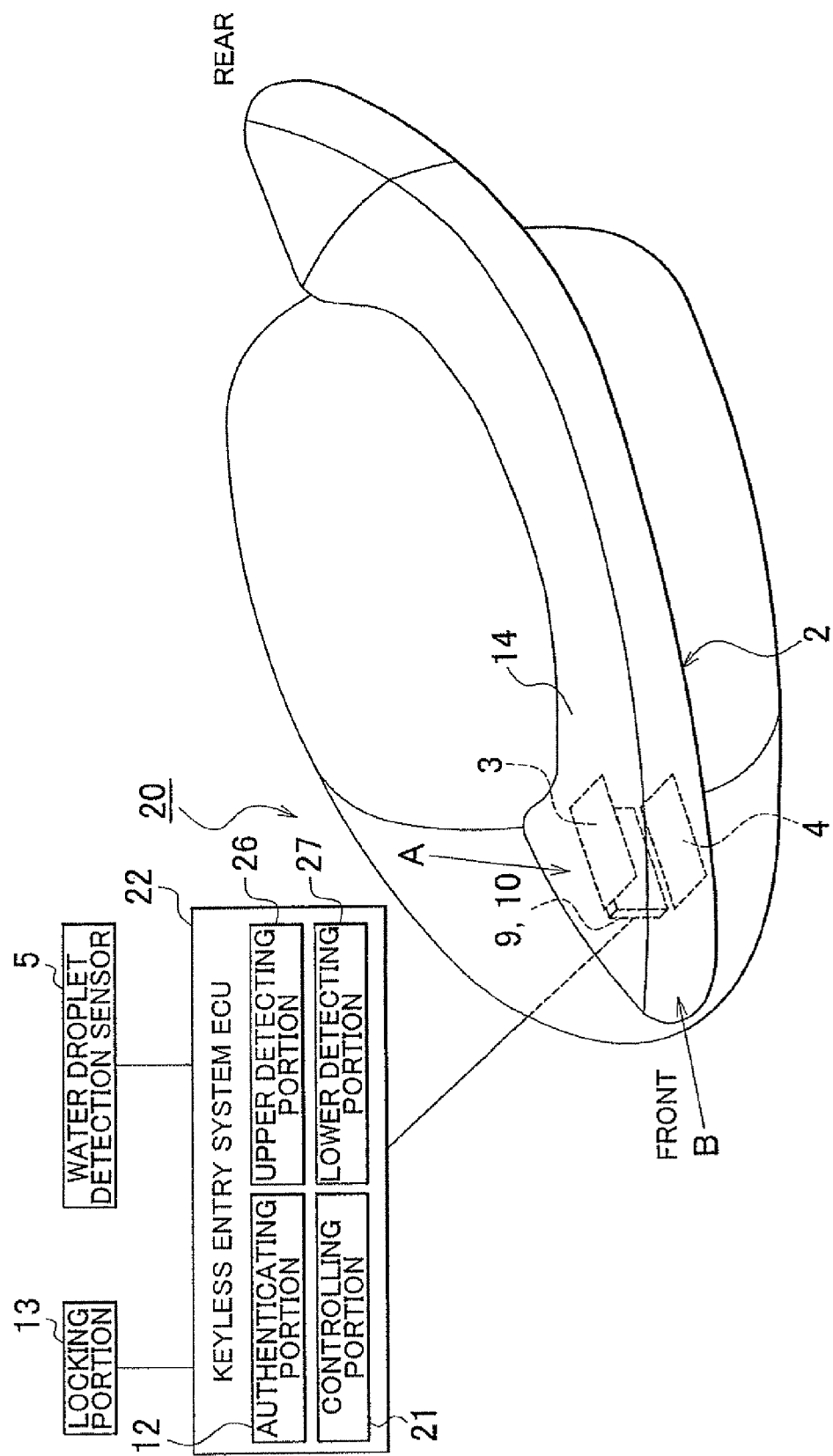
FIG. 9 is a perspective view of a door handle provided with a capacitance touch sensing device according to a third example embodiment of the invention.

FIG. 9 is a perspective view of a door handle provided with the capacitance touch sensing device according to the third example embodiment.

The capacitance touch sensing device 20 according to the third example embodiment differs from the capacitance touch sensing device 1 according to the first example embodiment in that i) a water droplet detection sensor 5 is provided, ii) an upper detecting portion 26 is provided instead of the upper detecting portion 6, iii) a lower detecting portion 27 is provided instead of the lower detecting portion 7, and iv) a controlling portion 21 is provided instead of the controlling portion 8. The other structure is the same as that in the first example embodiment and will therefore be denoted by the same reference numerals and descriptions thereof will be omitted.

The capacitance touch sensing device 20 includes the upper sensor electrode 3, the lower sensor electrode 4, the water droplet detection sensor 5, the upper driving portion 9, the lower driving portion 10, the upper detecting portion 26, the lower detecting portion 27, and the controlling portion 21.

The water droplet detection sensor 5 detects the amount of water droplets on the vehicle body. The water droplet detection sensor 5 includes, for example, an LED and a photodiode. The water droplet detection sensor 5 reflects light emitted from the LED on the front windshield, receives the reflected light with the photodiode, and detects the amount of water droplets based on the amount of light received. When there are water droplets on the front windshield, some of the light emitted by the LED is transmitted outside the front windshield through those water droplets so the amount of light received by the photodiode decreases. Therefore, less light is received by the photodiode as the amount of water droplets on the front windshield increases. When it is rains, the amount of water droplets that collect on the upper surface of the door handle 2 also changes according to the amount of water droplets on the front windshield. Accordingly, the amount of water droplets collected on the upper surface of the door handle 2 can be ascertained by detecting the amount of water droplets on the front windshield.

Figure 10:
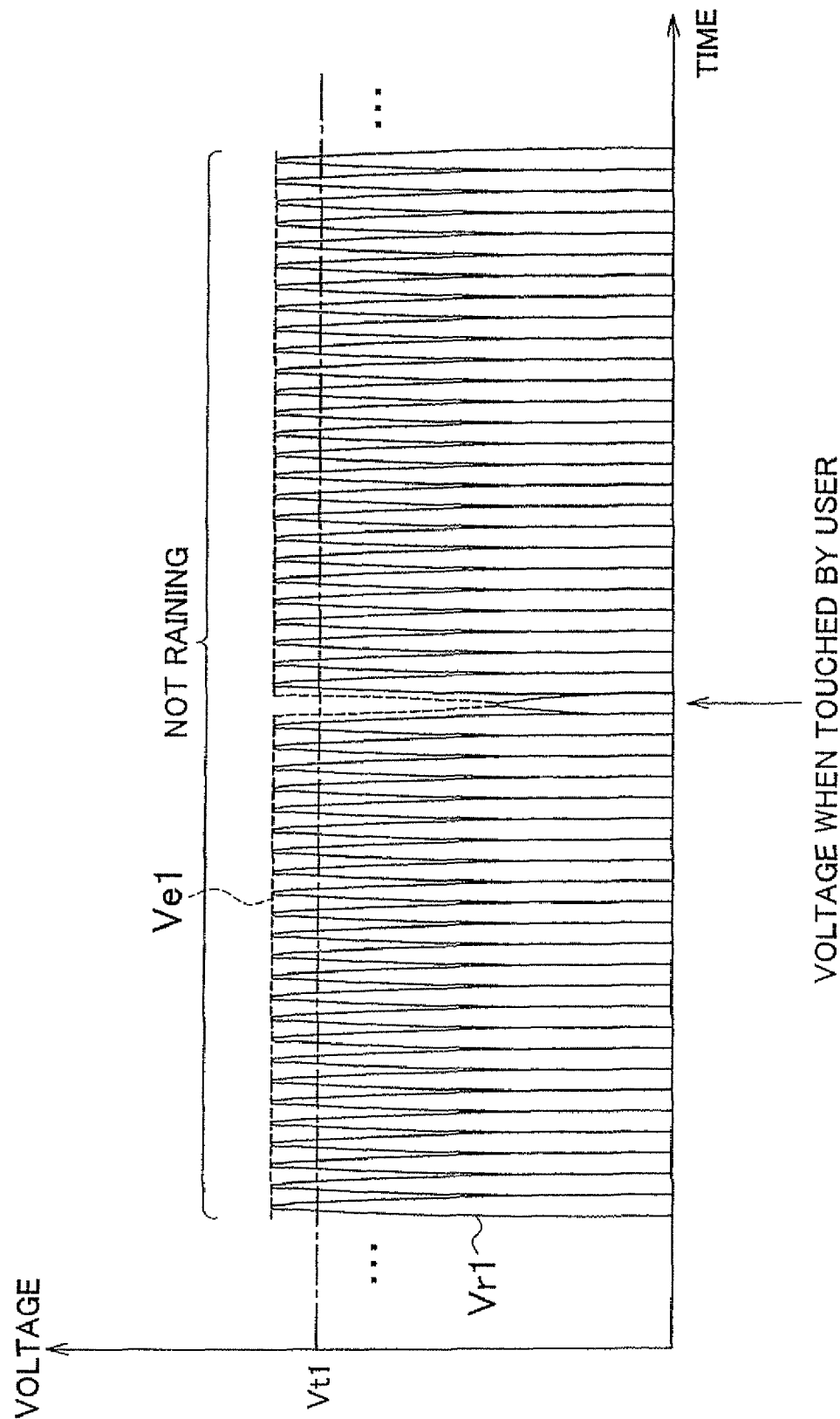
FIG. 10 is a chart showing the manner in which an upper detecting portion processes output voltage of an upper driving portion when it is not raining according to the third example embodiment of the invention.
Figure 11:
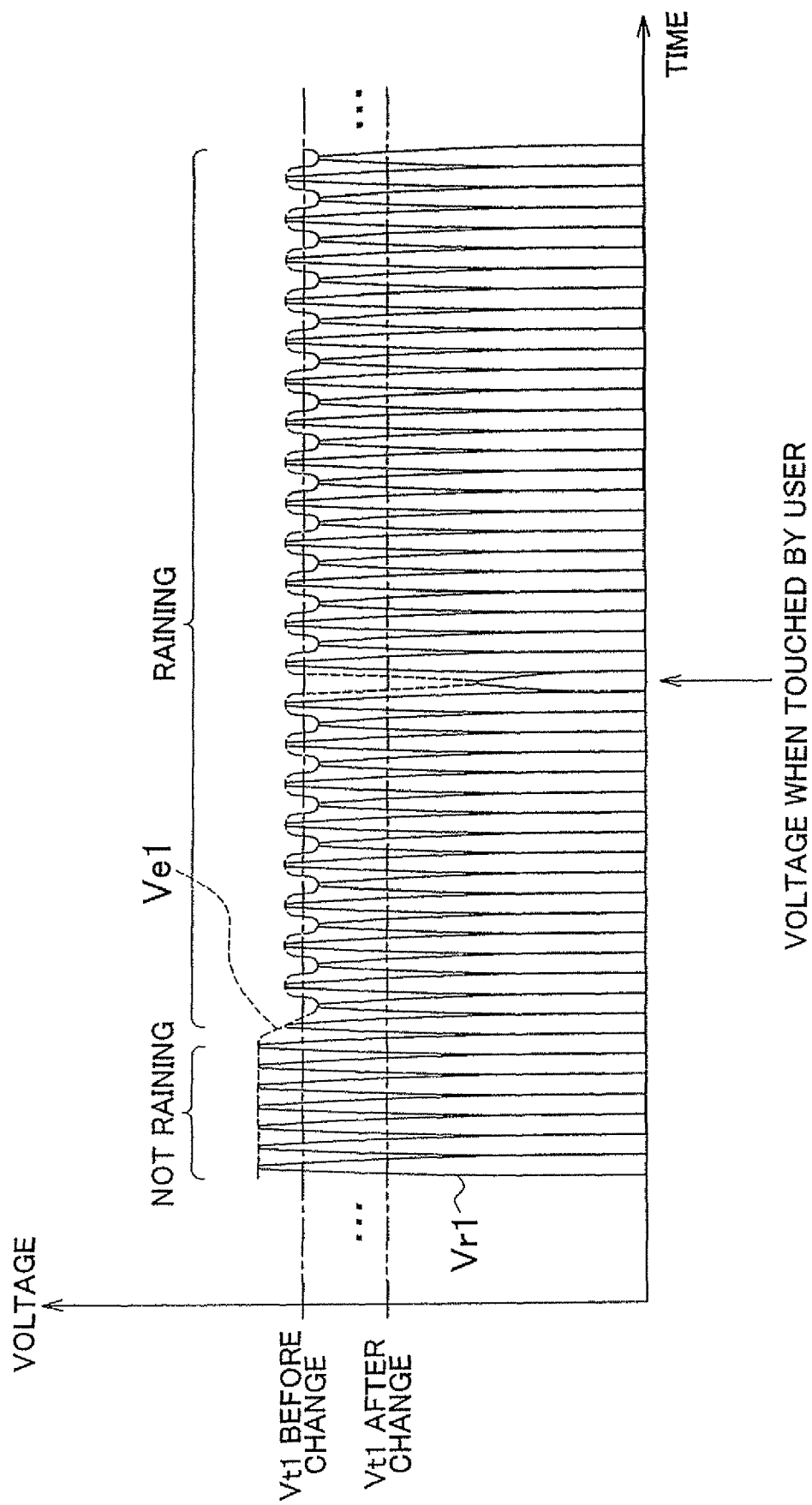
FIG. 11 is a chart showing the manner in which the upper detecting portion processes output voltage of the upper driving portion when it is raining according to the third example embodiment of the invention.

FIG. 10 is a chart showing the manner in which the upper detecting portion 26 processes output voltage of the upper driving portion 9 when it is not raining, and FIG. 11 is a chart showing the manner in which the upper detecting portion 26 processes output voltage of the upper driving portion 9 when it is raining. The upper detecting portion 26 detects when the user has touched the upper surface of the door handle 2 based on a signal output from the upper driving portion 9. More specifically, for example, the upper detecting portion 26 rectifies AC (alternating-current) voltage output from the upper driving portion 9 to obtain a rectified voltage Vr1 (as shown by the solid line in FIG. 11), and performs envelope detection of that rectified voltage Vr1, as shown in FIG. 11. The upper detecting portion 26 determines that the user has touched the upper surface of the door handle 2 when the value of the voltage Ve1 after envelope detection (as shown by the broken line in FIG. 11) is equal to or less than a threshold voltage Vt1. The upper detecting portion 26 is provided in a keyless entry system ECU 22.

The detection sensitivity of the upper detecting portion 26 changes according to the value of the threshold voltage Vt1. The detection sensitivity of the upper detecting portion 26 increases as the value of the threshold voltage Vt1 increases, and decreases as the value of the threshold voltage Vt1 decreases. The detection sensitivity of the upper detecting portion 26 refers to the sensitivity with which the upper detecting portion 26 detects the user touching the upper surface of the door handle 2.

When the user touches the upper surface of the door handle 2, the voltage Ve1 after envelope detection drops so that it is lower than it is before the user touches the upper surface of the door handle 2, as shown in FIG. 10. Therefore, the upper detecting portion 26 is able to detect when the user has touched the upper surface of the door handle 2 by detecting a decrease in the voltage Ve1. Accordingly, if the value of the threshold voltage Vt1 is increased within the fluctuation range of the voltage Ve1, the detection sensitivity of the upper detecting portion 26 increases. However, when rainwater collects on the upper surface of the door handle 2, the voltage Ve1 drops from what it is before the rainwater collects, as shown in FIG. 11, due to the change in the capacitance. Therefore, if the threshold voltage Vt1 is set too high when it is raining (see Vt1 on the upper side in FIG. 11), it may be erroneously determined that the drop in voltage Ve1 that occurs when rainwater collects is due to the user touching the door handle 2. Therefore, the threshold voltage Vt1 is set lower so that it will not become higher than the voltage Ve1 when rainwater has collected (see FIG. 11). As a result, the detection sensitivity of the upper detecting portion 26 is kept as high as possible when it is not raining, yet the upper detecting portion 26 will not erroneously detect rainwater that has collected on the door handle 2 as contact with the door handle 2 by the user when it is raining. Incidentally, when it is raining, the detection sensitivity of the upper detecting portion 26 is reduced but the detection sensitivity of the lower detecting portion 27 is not. Therefore, when the user touches the lower surface of the door handle 2, the lower detecting portion 27 detects that contact with high sensitivity. Incidentally, another method of detection may also be used in this example embodiment.

Figure 12:
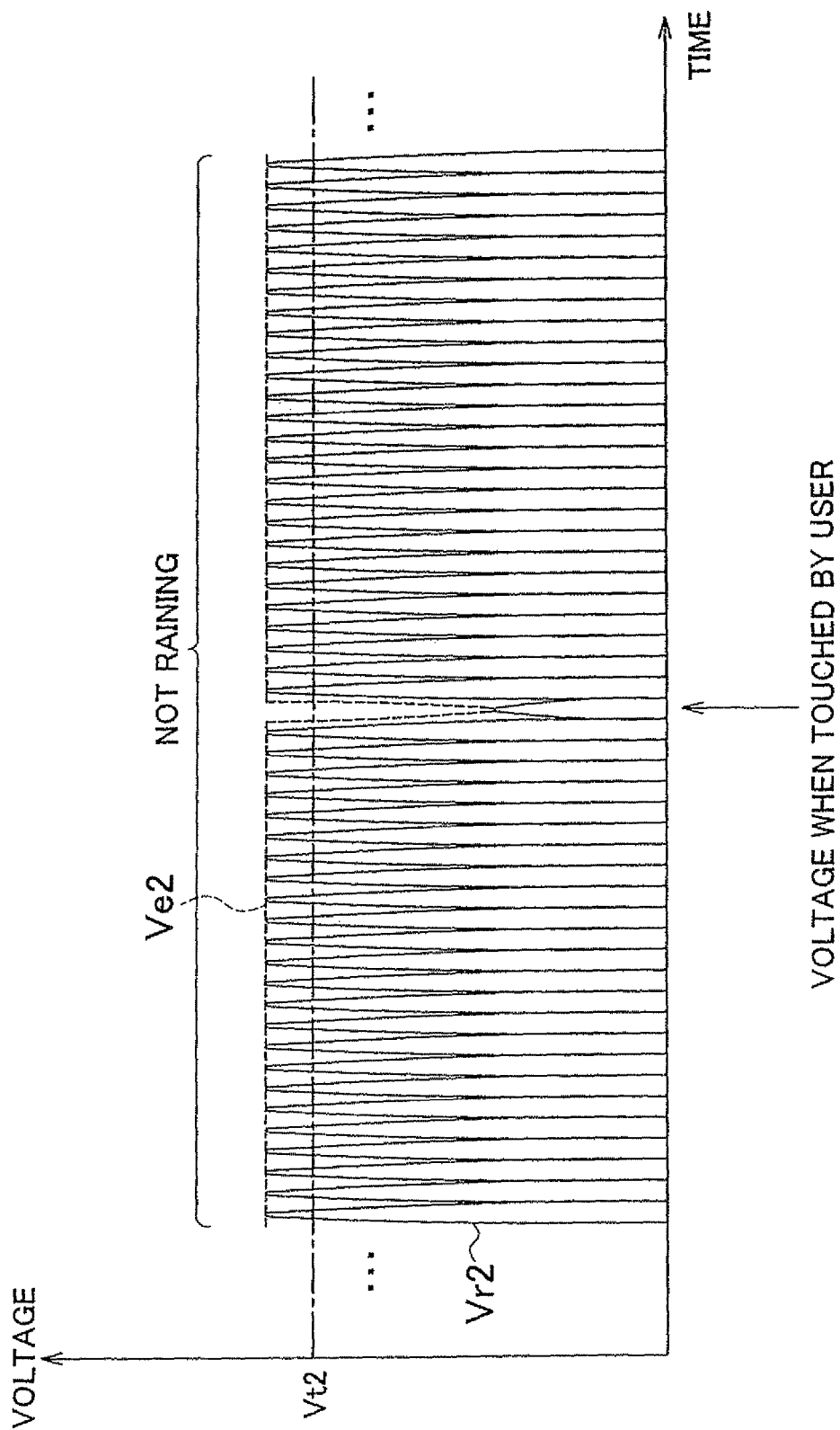
FIG. 12 is a chart showing the manner in which a lower detecting portion processes output voltage of a lower driving portion when it is not raining according to the third example embodiment of the invention.
Figure 13:
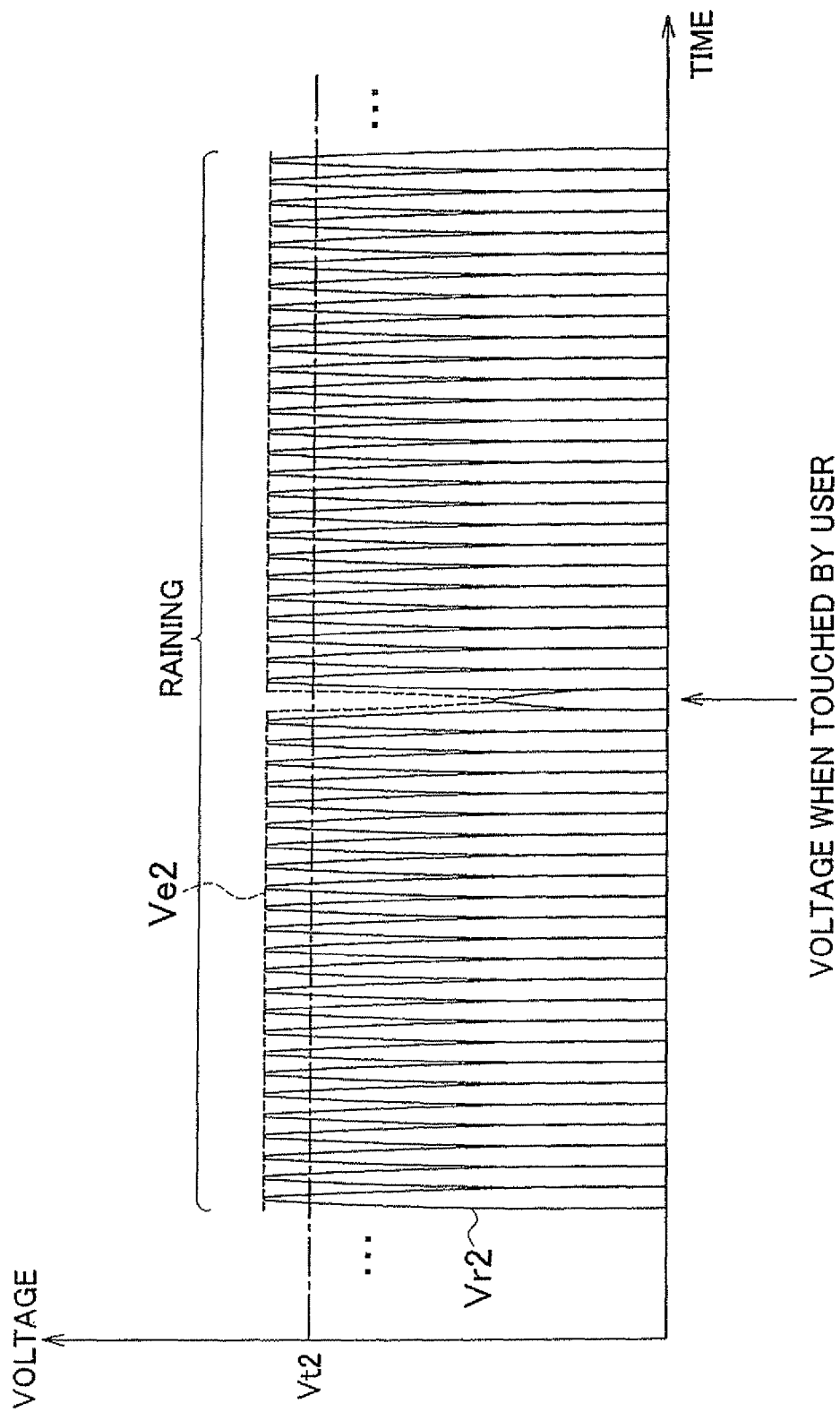
FIG. 13 is a chart showing the manner in which the lower detecting portion processes output voltage of the lower driving portion when it is raining according to the third example embodiment of the invention.

FIG. 12 is a chart showing the manner in which a lower detecting portion 27 processes output voltage of the lower driving portion 10 when it is not raining, and FIG. 13 is a chart showing the manner in which the lower detecting portion 27 processes output voltage of the lower driving portion 10 when it is raining. The lower detecting portion 27 detects when the user has touched the lower surface of the door handle 2 based on a signal output from the lower driving portion 10. More specifically, for example, the lower detecting portion 27 rectifies AC (alternating-current) voltage output from the lower driving portion 10 to obtain a rectified voltage Vr2 (as shown by the solid line in FIG. 13), and performs envelope detection of that rectified voltage Vr2, as shown in FIG. 13. The lower detecting portion 27 determines that the user has touched the lower surface of the door handle 2 when the value of the voltage Ve2 after envelope detection (as shown by the broken line in FIG. 13) is equal to or less than a threshold voltage Vt2. The lower detecting portion 27 is provided in the keyless entry system ECU 22.

The detection sensitivity of the lower detecting portion 27 is not reduced even if it is raining. The detection sensitivity of the lower detecting portion 27 refers to the sensitivity with which the lower detecting portion 27 detects the user touching the lower surface of the door handle 2. When it is not raining, the threshold voltage Vt1 and the threshold voltage Vt2 are set to the same high value.

When the user touches the lower surface of the door handle 2, the voltage Ve2 after envelope detection drops so that it is lower than it is before the user touches the layer surface of the door handle 2, as shown in FIG. 13. Therefore, the lower detecting portion 27 is able to detect when the user has touched the lower surface of the door handle 2 by detecting a decrease in the voltage Ve2. Accordingly, if the value of the threshold voltage Vt2 is increased within the fluctuation range of the voltage Ve2, the detection sensitivity of the lower detecting portion 27 increases. If it is unlikely that rainwater will collect on the bottom surface of the door handle 2 even if it is raining, then it is unlikely that there will be an erroneous detection of contact due to collected rainwater, even the detection sensitivity of the lower detecting portion 27 is not reduced. Therefore, even if it is raining, the detection sensitivity of the lower detecting portion 27 is kept high so contact with the lower surface of the door handle 2 by the user can be detected with high sensitivity. Incidentally, another method of detection may also be used in this example embodiment.

When the water droplet detection sensor 5 detects that the amount of water droplets on the vehicle body has reached a predetermined amount, the controlling portion 21 reduces the detection sensitivity of the upper detecting portion 26 so that it is lower than the detection sensitivity of the lower detecting portion 27. More specifically, for example, the controlling portion 21 reduces the threshold voltage Vt1 so that it is lower than the threshold voltage Vt2. Accordingly, as described above, the detection sensitivity of the upper detecting portion 26 is kept as high as possible when it is not raining, and rainwater collected on the door handle 2 when it is raining will not be erroneously detected as contact with the door handle 2 by the user. Incidentally, when it raining, the detection sensitivity of the upper detecting portion 26 is reduced but the detection sensitivity of the lower detecting portion 27 is not so the user can simply touch the lower surface of the door handle 2. Also, even if the detection sensitivity of the upper detecting portion 26 is reduced, the upper detecting portion 26 is still able to detect contact with the door handle 2 by the user.

Here, the controlling portion 21 preferably changes the amount that the detection sensitivity of the upper detecting portion 26 is reduced according to the amount of water droplets on the vehicle body. In this case, the detection sensitivity of the upper detecting portion 26 can be set to a detection sensitivity that is appropriate for the amount of water droplets.

Also, the controlling portion 21 preferably gradually increases the amount that the detection sensitivity of the upper detecting portion 26 is reduced as the amount of water droplets on the vehicle body increases. In this case, the detection sensitivity of the upper detecting portion 26 can be set to a detection sensitivity that is appropriate for the amount of increase in the water droplets.

Next, the operation of the capacitance touch sensing device 20 according to the third example embodiment will be described with reference to the drawings. Incidentally, user authentication and locking of the door are not characteristics of this example embodiment so descriptions thereof will be omitted.

Figure 14:
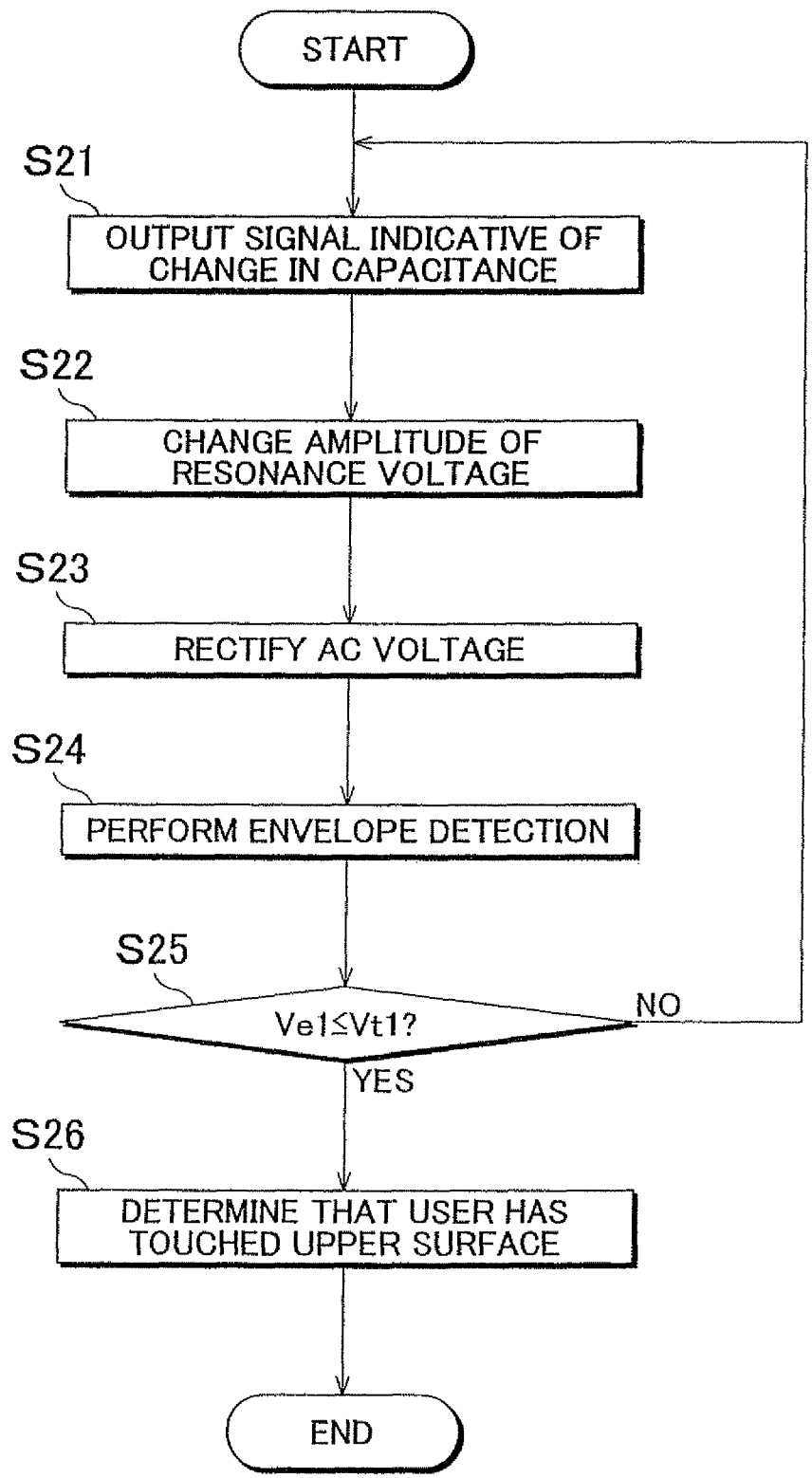
FIG. 14 is a flowchart illustrating an operation to detect contact with an upper surface of the door handle when it is not raining according to the third example embodiment of the invention.

First, an operation to detect contact with the upper surface of the door handle 2 when it is not raining will be described. FIG. 14 is a flowchart illustrating an operation to detect contact with the upper surface of the door handle 2 when it is not raining. When the user touches the upper surface of the front portion of the door handle 2, the capacitance near the upper sensor electrode 3 changes in the capacitance touch sensing device 20. The upper sensor electrode 3 outputs a signal indicative of that change in capacitance to the upper driving portion 9 (step S21). The upper driving portion 9 then changes the amplitude of the output voltage of the resonance circuit based on the signal received from the upper sensor electrode 3 (step S22). This change in amplitude indicates that the user has touched the upper surface of the front portion of the door handle 2.

The upper detecting portion 26 rectifies the AC voltage output by the upper driving portion 9 to obtain the rectified voltage Vr1 (step S23) and performs envelope detection of that rectified voltage Vr1 (step S24). The upper detecting portion 26 then compares the value of the voltage Ve1 after envelope detection with the threshold voltage Vt1 (step S25). If the voltage Ve1 is equal to or less than the threshold voltage Vt1, the upper detecting portion 26 determines that the user has touched the upper surface of the front portion of the door handle 2 (step S26). If, on the other hand, the voltage Ve1 is greater than the threshold voltage Vt1, the upper detecting portion 26 determines that the user has not touched the upper surface of the front portion of the door handle 2 and the process returns to step S21. This is the operation for detecting contact with the upper surface of the door handle 2.

Figure 15:
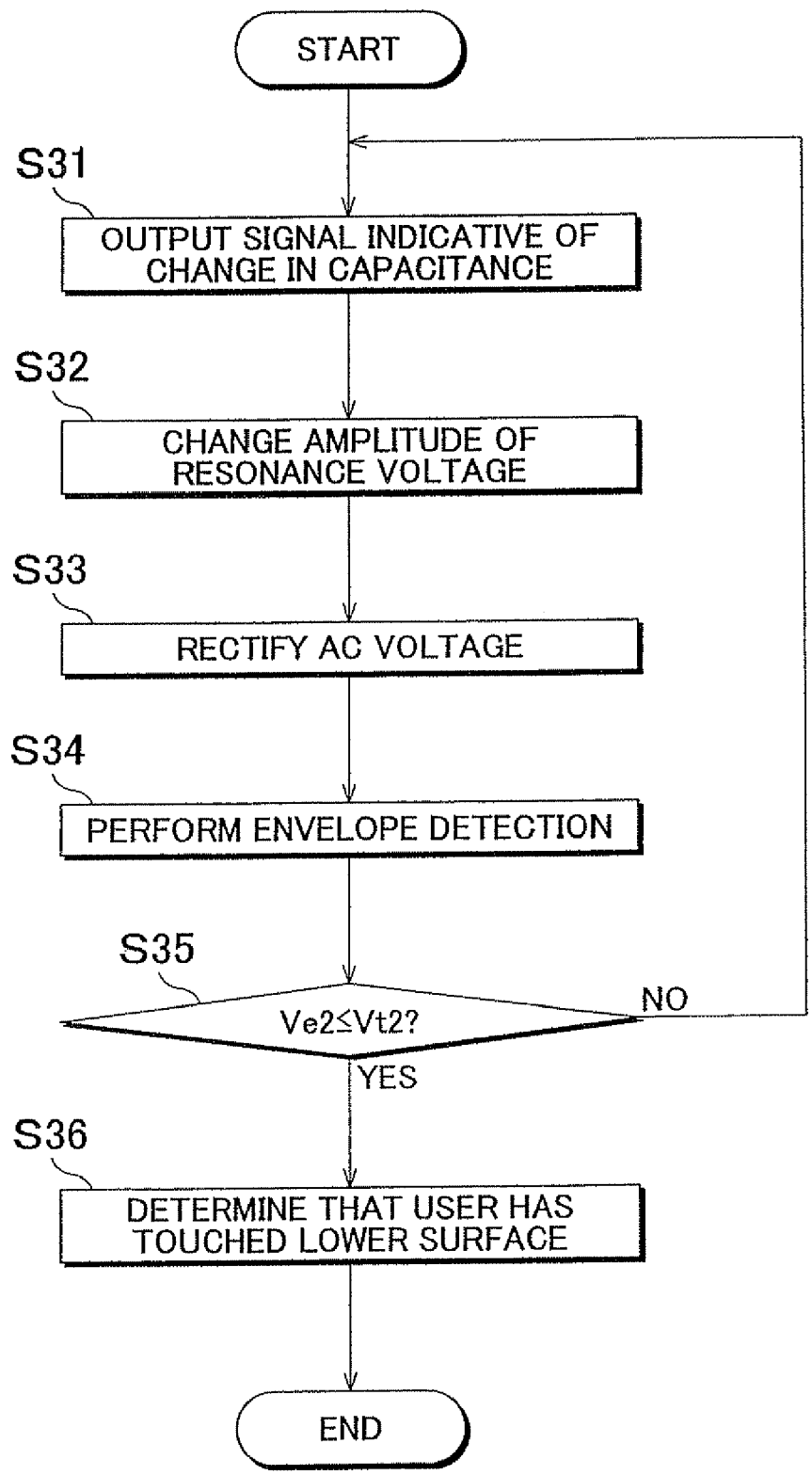
FIG. 15 is a flowchart illustrating an operation to detect contact with a lower surface of the door handle when it is not raining according to the third example embodiment of the invention.

Next, an operation to detect contact with the lower surface of the door handle 2 when it is not raining will be described. FIG. 15 is a flowchart illustrating an operation to detect contact with the lower surface of the door handle 2 when it is not raining. When the user touches the lower surface of the front portion of the door handle 2, the capacitance near the lower sensor electrode 4 changes in the capacitance touch sensing device 20. The lower sensor electrode 4 outputs a signal indicative of that change in capacitance to the lower driving portion 10 (step S31). The lower driving portion 10 then changes the amplitude of the output voltage of the resonance circuit based on the signal received from the lower sensor electrode 4 (step S32). This change in amplitude indicates that the user has touched the lower surface of the front portion of the door handle 2.

The lower detecting portion 27 rectifies the AC voltage output by the lower driving portion 10 to obtain the rectified voltage Vr2 (step S33) and performs envelope detection of that rectified voltage Vr2 (step S34). The lower detecting portion, 27 then compares the value of the voltage Ve2 after envelope detection with the threshold voltage Vt2 (which is equal to the threshold voltage Vt1) (step S35). If the voltage Ve2 is equal to or less than the threshold voltage Vt2, the lower detecting portion 27 determines that the user has touched the lower surface of the front portion of the door handle 2 (step S36). If, on the other hand, the voltage Ve2 is greater than the threshold voltage V12, the lower detecting portion 27 determines that the user has not touched the lower surface of the front portion of the door handle 2 and the process returns to step S31. This is the operation for detecting contact with the lower surface of the door handle 2.

Figure 16:
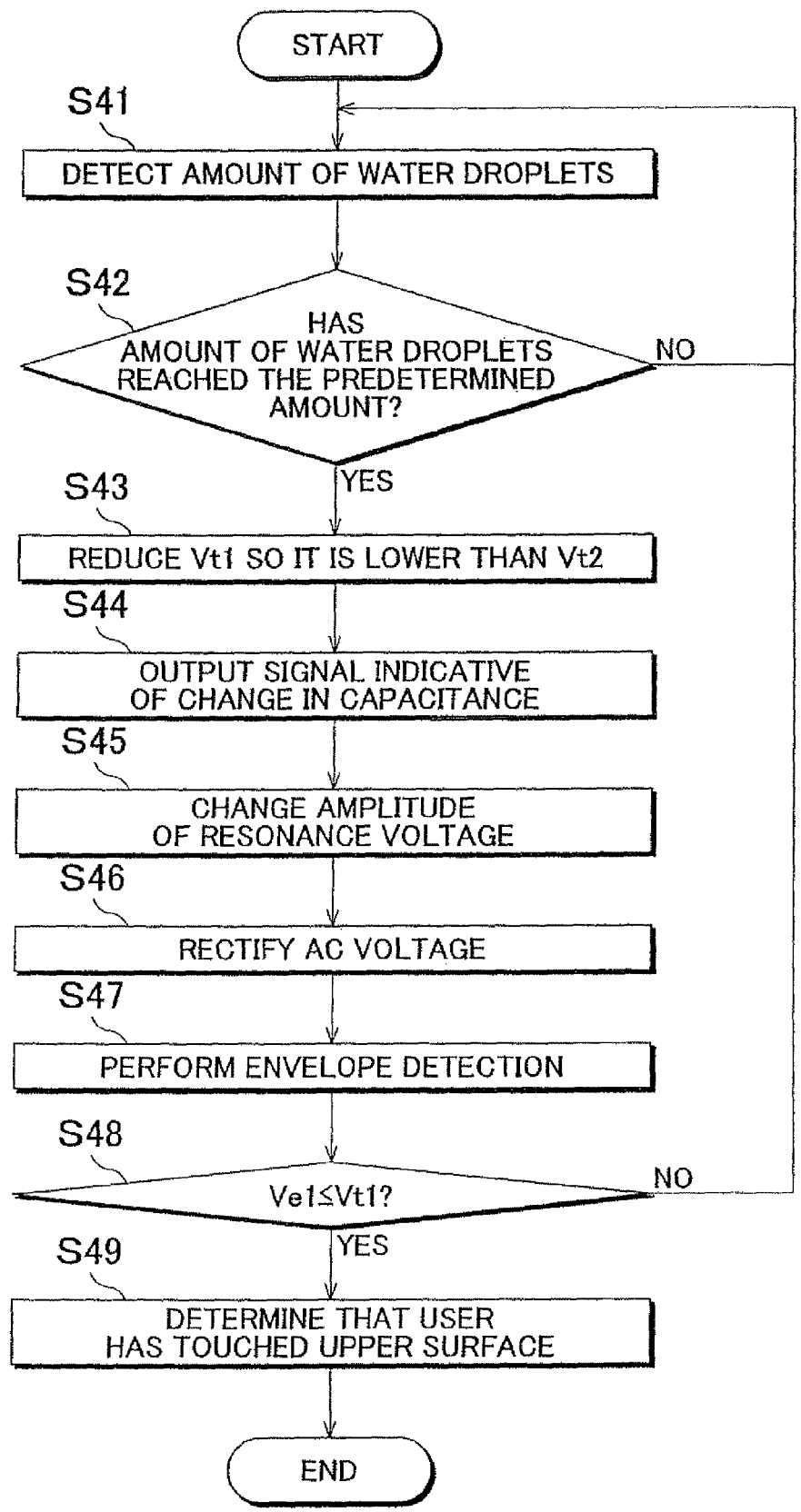
FIG. 16 is a flowchart illustrating an operation to detect contact with the upper surface of the door handle when it is raining according to the third example embodiment of the invention.

Next, an operation to detect contact with the upper surface of the door handle 2 when it is raining will be described. FIG. 16 is a flowchart illustrating an operation to detect contact with the upper surface of the door handle 2 when it is raining. When it is raining, the water droplet detection sensor 5 detects the amount of water droplets on the vehicle body (e.g., the front windshield) (step S41). The water droplet detection sensor 5 then determines whether the amount of water droplets on the vehicle body has reached a predetermined amount (step S42). If the water droplet detection sensor 5 determines that the amount of water droplets on the vehicle body has reached the predetermined amount, the controlling portion 21 reduces the detection sensitivity of the upper detecting portion 26 so that it is lower than the detection sensitivity of the lower detecting portion 27. More specifically, for example, the controlling portion 21 reduces the threshold voltage Vt1 so that it is lower than the threshold voltage Vt2 (step S43).

Then, when the user touches the upper surface of the front portion of the door handle 2, the capacitance near the upper sensor electrode 3 changes in the capacitance touch sensing device 20. The upper sensor electrode 3 outputs a signal indicative of that change in capacitance to the upper driving portion 9 (step S44). The upper driving portion 9 then changes the amplitude of the output voltage of the resonance circuit based on the signal received from the upper sensor electrode 3 (step S45). This change in amplitude indicates that the user has touched the upper surface of the front portion of the door handle 2.

The upper detecting portion 26 rectifies the AC voltage output by the upper driving portion 9 to obtain the rectified voltage Vr1 (step S46) and performs envelope detection of that rectified voltage Vr1 (step S47). The upper detecting portion 26 then compares the value of the voltage Ve1 after envelope detection with the threshold voltage Vt1 that has been reduced as described above (step S48). If the voltage Ve1 is equal to or less than the threshold voltage Vt1, the upper detecting portion 26 determines that the user has touched the upper surface of the front portion of the door handle 2 (step S49). If, on the other hand, the voltage Ve1 is greater than the threshold voltage Vt1, the upper detecting portion 26 determines that the user has not touched the upper surface of the front portion of the door handle 2 and the process returns to step S41. Incidentally, in step S43, the detection sensitivity of the upper detecting portion 26 is reduced so that it is lower than the detection sensitivity of the lower detecting portion 27. Accordingly, even if rainwater has collected on the upper surface of the door handle 2, the upper detecting portion 26 will not erroneously detect that collected rainwater as the user touching the door handle 2. This is the operation for detecting contact with the upper surface of the door handle 2.

The operation for detecting contact with the lower surface of the door handle 2 when it is raining is the same as the operation for detecting contact with the lower surface of the door handle 2 when it is not raining so a description thereof will be omitted.

As described above, according to the third example embodiment, the detection sensitivity of the upper detecting portion 26 is set lower than the detection sensitivity of the lower detecting portion 27 when the amount of raindrops on the vehicle body has reached a predetermined amount. Accordingly, only the detection sensitivity of the upper detecting portion 26 is reduced, while the detection sensitivity of the lower detecting portion 27 remains high. This makes it possible to detect contact with high sensitivity by the lower detecting portion 27 while inhibiting erroneous detection by the upper detecting portion 26. Also, providing the upper detecting portion 26 and the lower detecting portion 27 enables the door handle 2 to be vertically symmetrical, with the upper and lower portions having the same shape and function. As a result, the same parts can be used in the door handles 2 of the both the left and right doors of the vehicle, which enables the manufacturing cost of the door handle 2 to be reduced.

In the third example embodiment, the detection sensitivity of the upper detecting portion 26 is controlled so that it is lower than the detection sensitivity of the lower detecting portion 27 when it is raining. Conversely, in a fourth example embodiment, the detection sensitivity of a lower detecting portion, not shown, is controlled so that it is lower than the detection sensitivity of an upper detecting portion, also not shown, when it is raining. The other structure of the fourth example embodiment is the same as that of the third example embodiment.

The fourth example embodiment enables highly sensitive contact detection by the upper detecting portion while inhibiting erroneous touch detection by the lower detecting portion when rainwater tends to collect on the lower surface of the door handle when it is raining.

Next, a capacitance touch sensing device according to a fifth example embodiment of the invention will be described with reference to the drawings.

Figure 17:
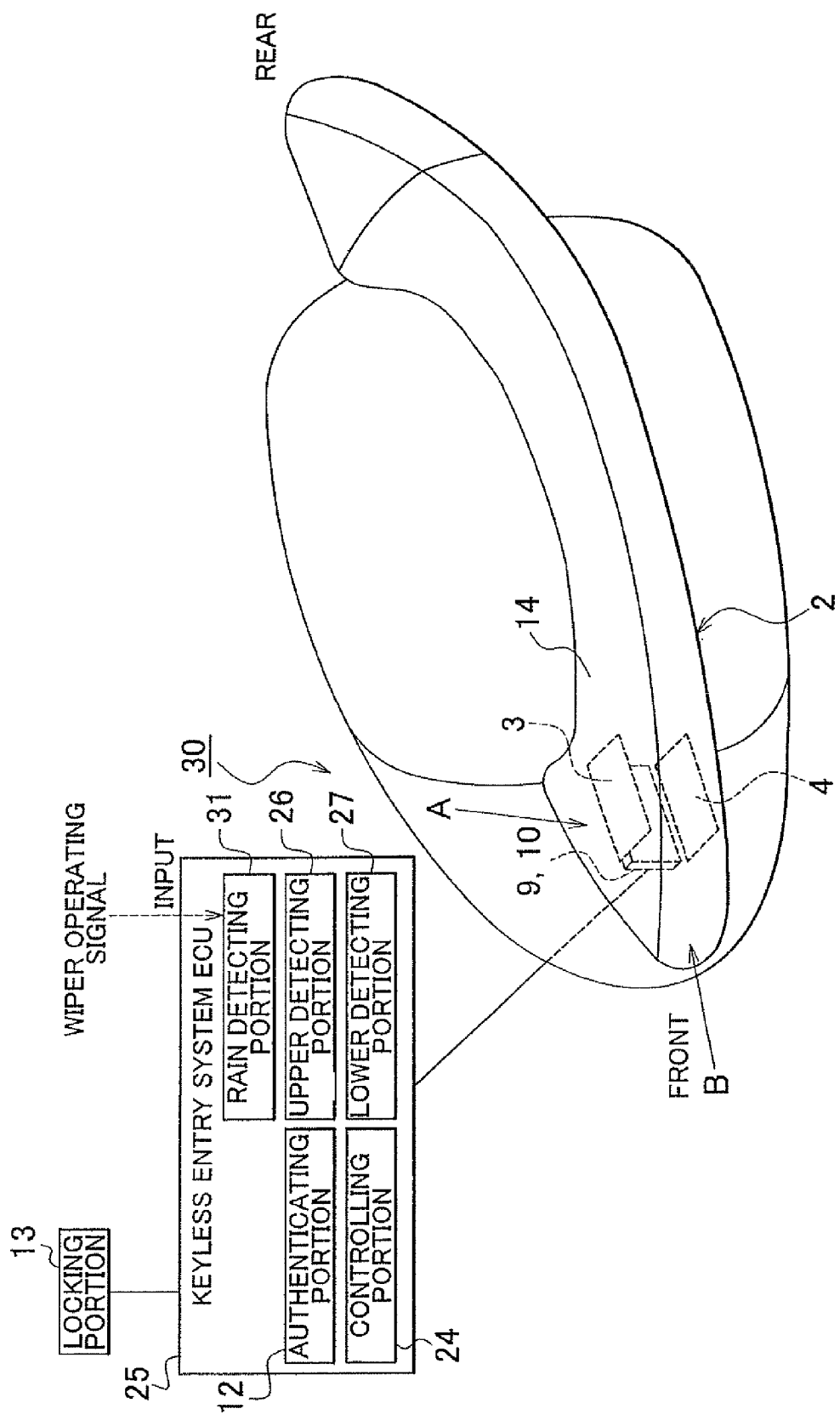
FIG. 17 is a perspective view of a door handle provided with a capacitance touch sensing device according to a fifth example embodiment of the invention.

FIG. 17 is a perspective view of a door handle provided with the capacitance touch sensing device according to the fifth example embodiment.

The capacitance touch sensing device 30 according to the fifth example embodiment differs from the capacitance touch sensing device 20 according to the third example embodiment in that i) the water droplet detection sensor 5 is omitted, ii) a controlling portion 24 is provided instead of the controlling portion 21, and iii) a rain detecting portion 31 is provided. The other structure is the same as that in the third example embodiment and will therefore be denoted by the same reference numerals, and descriptions thereof will be omitted.

The capacitance touch sensing device 30 includes the upper sensor electrode 3, the lower sensor electrode 4, the upper driving portion 9, the lower driving portion 10, the upper detecting portion 26, the lower detecting portion 27, the rain detecting portion 31, and the controlling portion 24.

The rain detecting portion 31 detects rain based on the operation of windshield wipers (hereinafter simply referred to as "wipers"), not shown. The wipers are operated when it rains, and the operating speed of the wipers is increased or decreased according to the amount of rain. Accordingly, the wipers can be used to detect when it is raining as well as the amount of rain. The rain detecting portion 31 is provided in a keyless entry system ECU 25. The rain detecting portion 31 receives a wiper operating signal, which controls the operation of the wipers, from a wiper control portion (not shown) that controls wiper operation, and detects rain based on this wiper operation signal. The wiper operation signal is a signal that controls an electric motor that drives the wipers. The wiper operation signal may be, for example, an intermittent operating signal that drives the electric motor intermittently, a LOW operating signal that continuously drives the electric motor at slow speed, a HIGH operating signal that continuously drives the electric motor at high speed, or a wiper stopping signal that stops the electric motor. Upon receiving an intermittent operating signal, a LOW operating signal, or a HIGH operating signal, for example, the rain detecting portion 31 outputs a signal indicating that it is raining (i.e., a rain detection signal) to the controlling portion 24. Also, upon receiving a wiper stopping signal, the rain detecting portion 31 outputs a signal indicating that it is not raining to the controlling portion 24.

Incidentally, when the rain detecting portion 31 receives an intermittent operating signal, it may also output a rain detection signal indicative of light rain (i.e., a small amount of rain) to the controlling portion 24. Similarly, when the rain detecting portion 31 receives a LOW operating signal, it may output a rain detection signal indicative of moderate rain (i.e., a medium amount of rain) to the controlling portion 24. Also, when the rain detecting portion 31 receives a HIGH operating signal, it may output a rain detection signal indicative of heavy rain (i.e., a large amount of rain) to the controlling portion 24. Incidentally, a water droplet detection sensor may also be provided and the wiper controlling portion may automatically control the wiper operation based on a water droplet sensor signal from the water droplet detection sensor, or control the wiper operation based on a switching operation by the user him/herself to turn on the wipers.

When the rain detecting portion 31 detects rain, the controlling portion 24 reduces the detection sensitivity of the upper detecting portion 26 so that it is lower than the detection sensitivity of the lower detecting portion 27. More specifically, for example, the controlling portion 24 reduces the threshold voltage Vt1 so that it is lower than the threshold voltage Vt2. Accordingly, as described above, the detection sensitivity of the upper detecting portion 26 is kept as high as possible when it is not raining, and rainwater collected on the door handle 2 when it is raining will not be erroneously detected as contact with the door handle 2 by the user. Incidentally, when it is raining, the detection sensitivity of the upper detecting portion 26 is reduced but the detection sensitivity of the lower detecting portion 27 is not so the user can simply touch the lower surface of the door handle 2. Also, even if the detection sensitivity of the upper detecting portion 26 is reduced, the upper detecting portion 26 is still able to detect contact with the door handle 2 by the user.

Incidentally, when the controlling portion 24 receives a rain detection signal indicative of light, moderate, or heavy rain from the rain detecting portion 31, the controlling portion 24 preferably changes the amount that the detection sensitivity of the upper detecting portion 26 is reduced according to that signal. In this case, the detection sensitivity of the upper detecting portion 26 may be set to a detection sensitivity that is appropriate for the amount of rain.

Also, when the controlling portion 24 receives a rain detection signal indicative of light, moderate, or heavy rain from the rain detecting portion 31, the controlling portion 24 preferably gradually increases the amount that the detection sensitivity of the upper detecting portion 26 is reduced in that order (i.e., as the amount of rainfall increases from light to moderate to heavy). In this case, the detection sensitivity of the upper detecting portion 26 may be set to a detection sensitivity that is appropriate for the amount of rain.

Next, the operation of the capacitance touch sensing device 30 according to the fifth example embodiment will be described with reference to the drawings. Incidentally, user authentication and locking of the door are not characteristics of this example embodiment so descriptions thereof will be omitted.

Figure 18:
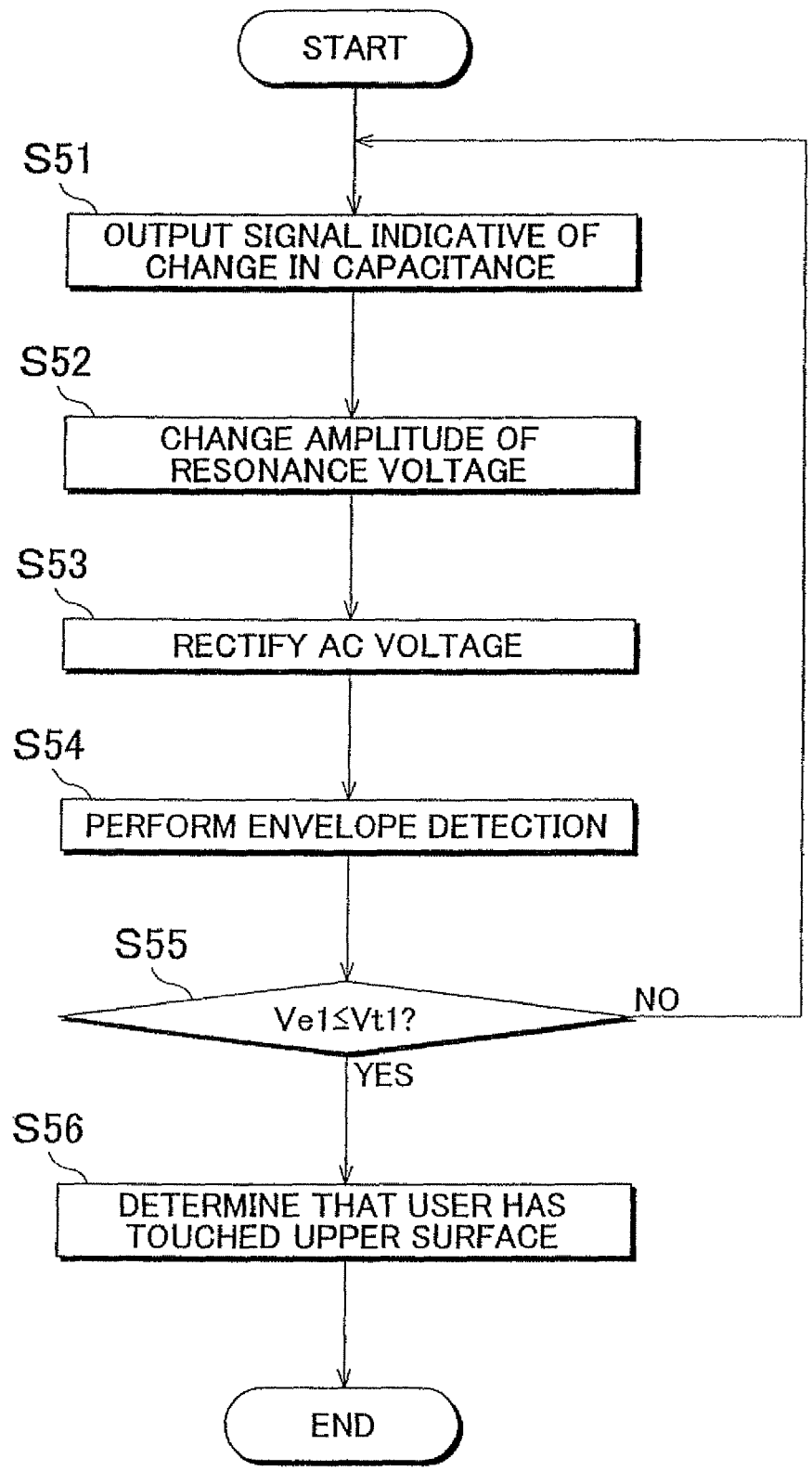
FIG. 18 is a flowchart illustrating an operation to detect contact with an upper surface of the door handle when it is not raining according to the fifth example embodiment of the invention.

First, an operation to detect contact with the upper surface of the door handle 2 when it is not raining will be described. FIG. 18 is a flowchart illustrating an operation to detect contact with the upper surface of the door handle 2 when it is not raining. When the user touches the upper surface of the front portion of the door handle 2, the capacitance near the upper sensor electrode 3 changes in the capacitance touch sensing device 30. The upper sensor electrode 3 outputs a signal indicative of that change in capacitance to the upper driving portion 9 (step S51). The upper driving portion 9 then changes the amplitude of the output voltage of the resonance circuit based on the signal received from the upper sensor electrode 3 (step S52). This change in amplitude indicates that the user has touched the upper surface of the front portion of the door handle 2.

The upper detecting portion 26 rectifies the AC voltage output by the upper driving portion 9 to obtain the rectified voltage Vr1 (step S53) and performs envelope detection of that rectified voltage Vr1 (step S54). The upper detecting portion 26 then compares the value of the voltage Ve1 after envelope detection with the threshold voltage Vt1 (step S55). If the voltage Ve1 is equal to or less than the threshold voltage Vt1, the upper detecting portion 26 determines that the user has touched the upper surface of the front portion of the door handle 2 (step S56). If, on the other hand, the voltage Ve1 is greater than the threshold voltage Vt1, the upper detecting portion 26 determines that the user has not touched the upper surface of the front portion of the door handle 2 and the process returns to step S51. This is the operation for detecting contact with the upper surface of the door handle 2.

Figure 19:
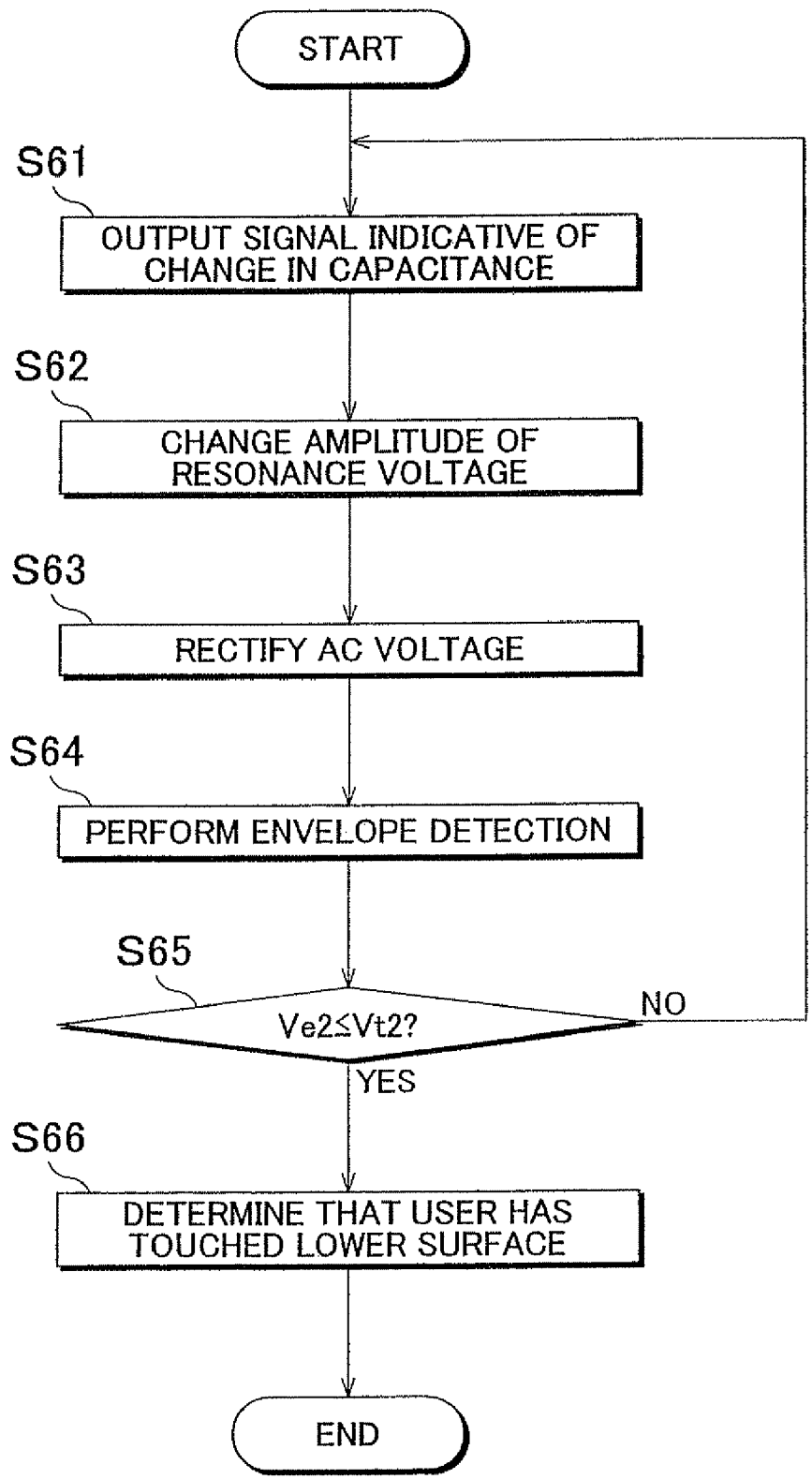
FIG. 19 is a flowchart illustrating an operation to detect contact with a lower surface of the door handle when it is not raining according to the fifth example embodiment of the invention.

Next, an operation to detect contact with the lower surface of the door handle 2 when it is not raining will be described. FIG. 19 is a flowchart illustrating an operation to detect contact with the lower surface of the door handle 2 when it is not raining. When the user touches the lower surface of the front portion of the door handle 2, the capacitance near the lower sensor electrode 4 changes in the capacitance touch sensing device 30. The lower sensor electrode 4 outputs a signal indicative of that change in capacitance to the lower driving portion 10 (step S61). The lower driving portion 10 then changes the amplitude of the output voltage of the resonance circuit based on the signal received from the lower sensor electrode 4 (step S62). This change in amplitude indicates that the user has touched the lower surface of the front portion of the door handle 2.

The lower detecting portion 27 rectifies the AC voltage output by the lower driving portion 10 to obtain the rectified voltage Vr2 (step S63) and performs envelope detection of that rectified voltage Vr2 (step S64). The lower detecting portion 27 then compares the value of the voltage Ve2 after envelope detection with the threshold voltage Vt2 (which is equal to the threshold voltage Vt1) (step S65). If the voltage Ve2 is equal to or less than the threshold voltage Vt2, the lower detecting portion 27 determines that the user has touched the lower surface of the front portion of the door handle 2 (step S66). If, on the other hand, the voltage Ve2 is greater than the threshold voltage Vt2, the lower detecting portion 27 determines that the user has not touched the lower surface of the front portion of the door handle 2 and the process returns to step S61. This is the operation for detecting contact with the lower surface of the door handle 2.

Figure 20:
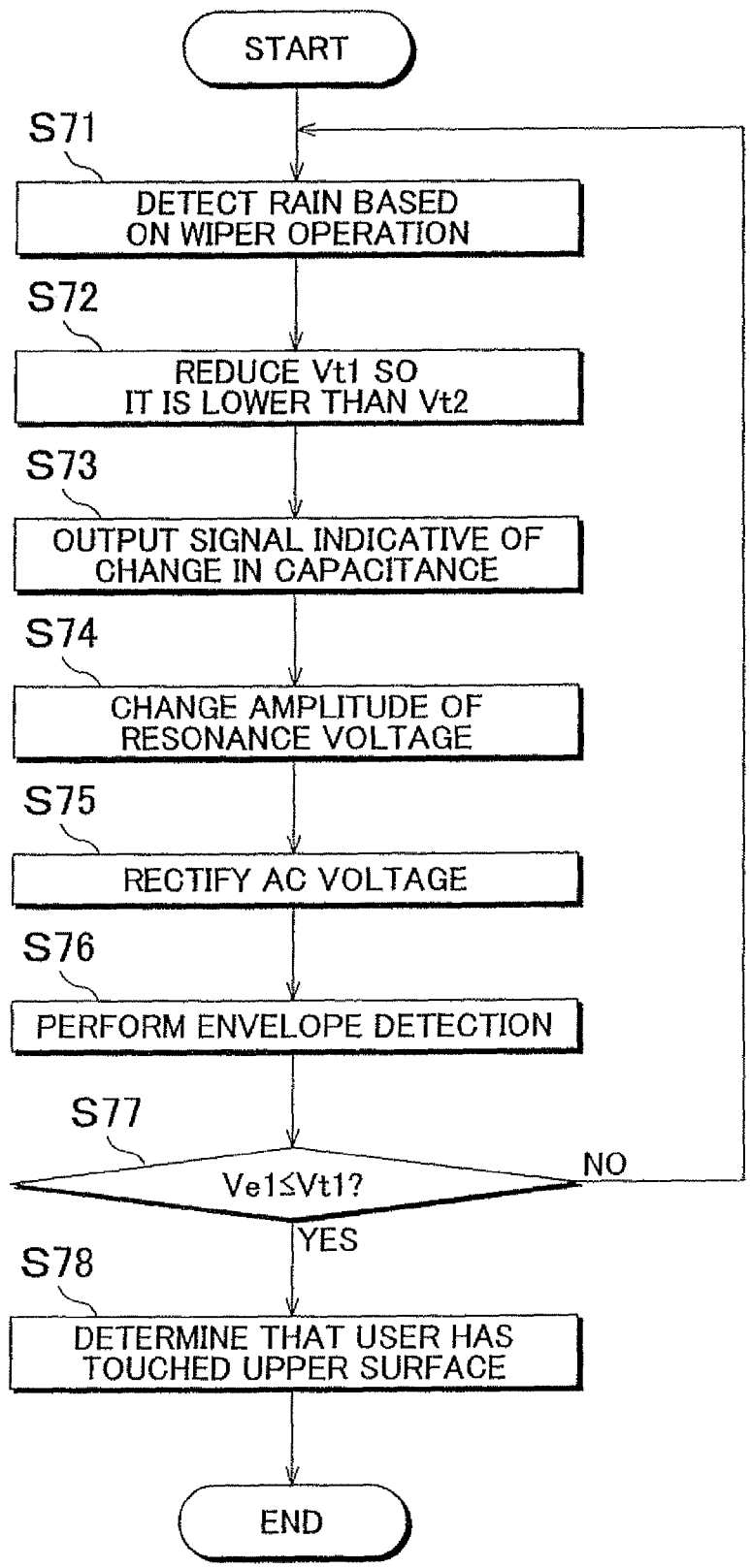
FIG. 20 is a flowchart illustrating an operation to detect contact with the upper surface of the door handle when it is raining according to the fifth example embodiment of the invention.

Next, an operation to detect contact with the upper surface of the door handle 2 when it is raining will be described. FIG. 20 is a flowchart illustrating an operation to detect contact with the upper surface of the door handle 2 when it is raining. When it rains, the rain detecting portion 31 detects the rain based on the operation of the wipers (step S71). More specifically, for example, when the rain detecting portion 31 receives an intermittent operating signal, a LOW operating signal, or a HIGH operating signal from the wiper controlling portion, not shown, the rain detecting portion 31 determines that it is raining and outputs a rain detection signal to the controlling portion 24. Upon receiving the rain detection signal from the rain detecting portion 31, the controlling portion 24 reduces the detection sensitivity of the upper detecting portion 26 so that it is lower than the detection sensitivity of the lower detecting portion 27. More specifically, for example, the controlling portion 24 reduces the threshold voltage Vt1 so that it is lower than the threshold voltage Vt2 (step S72).

Then, when the user touches the upper surface of the front portion of the door handle 2, the capacitance near the upper sensor electrode 3 changes in the capacitance touch sensing device 30. The upper sensor electrode 3 outputs a signal indicative of that change in capacitance to the upper driving portion 9 (step S73). The upper driving portion 9 then changes the amplitude of the output voltage of the resonance circuit based on the signal received from the upper sensor electrode 3 (step S74). This change in amplitude indicates that the user has touched the upper surface of the front portion of the door handle 2.

The upper detecting portion 26 rectifies the AC voltage output by the upper driving portion 9 to obtain the rectified voltage Vr1 (step S75) and performs envelope detection of that rectified voltage Vr1 (step S76). The upper detecting portion 26 then compares the value of the voltage Ve1 after envelope detection with the threshold voltage Vt1 that has been reduced as described above (step S77). If the voltage Ve1 is equal to or less than the threshold voltage Vt1, the upper detecting portion 26 determines that the user has touched the upper surface of the front portion of the door handle 2 (step S78). If, on the other hand, the voltage Ve1 is greater than the threshold voltage Vt1, the upper detecting portion 26 determines that the user has not touched the upper surface of the front portion of the door handle 2 and the process returns to step S71. Incidentally, in step S72, the detection sensitivity of the upper detecting portion 26 is reduced so that it is lower than the detection sensitivity of the lower detecting portion 27. Accordingly, even if rainwater has collected on the upper surface of the door handle 2, the upper detecting portion 26 will not erroneously detect that collected rainwater as the user touching the door handle 2. This is the operation for detecting contact with the upper surface of the door handle 2.

Incidentally, when the rain detecting portion 31 receives an intermittent operating signal, it may also output a rain detection signal indicative of light rain (i.e., a small amount of rain) to the controlling portion 24. Similarly, when the rain detecting portion 31 receives a LOW operating signal, it may output a rain detection signal indicative of moderate rain (i.e., a medium amount of rain) to the controlling portion 24. Also, when the rain detecting portion 31 receives a HIGH operating signal, it may output a rain detection signal indicative of heavy rain (i.e., a large amount of rain) to the controlling portion 24. In this case, in step S72, the controlling portion 24 may change the amount that the detection sensitivity of the upper detecting portion 26 is reduced according to the amount of rain. Also, when the rain detecting portion 31 receives a wiper stopping signal from the wiper controlling portion, the reduced detection sensitivity of the upper detecting portion 26 can be returned to its original high level.

The operation for detecting contact with the lower surface of the door handle 2 when it is raining is the same as the operation for detecting contact with the lower surface of the door handle 2 when it is not raining so a description thereof will be omitted.

As described above, according to the fifth example embodiment, the detection sensitivity of the upper detecting portion 26 is set lower than the detection sensitivity of the lower detecting portion 27 when rain has been detected based on operation of the wipers. Accordingly, only the detection sensitivity of the upper detecting portion 26 is reduced, while the detection sensitivity of the lower detecting portion 27 remains high. This makes it possible to detect contact with high sensitivity by the lower detecting portion 27 while inhibiting erroneous detection by the upper detecting portion 26. Also, providing the upper detecting portion 26 and the lower detecting portion 27 enables the door handle 2 to be vertically symmetrical, with the upper and lower portions having the same shape and function. As a result, the same parts can be used in the door handles 2 of both the left and right doors of the vehicle, which enables the manufacturing cost of the door handle 2 to be reduced.

In the fifth example embodiment, the detection sensitivity of the upper detecting portion 26 is controlled so that it is lower than the detection sensitivity of the lower detecting portion 27 when it is raining. Conversely, in a sixth example embodiment, the detection sensitivity of a lower detecting portion, not shown, is controlled so that it is lower than the detection sensitivity of an upper detecting portion, also not shown, when it is raining. The other structure of the sixth example embodiment is the same as that of the fifth example embodiment.

The sixth example embodiment enables highly sensitive contact detection by the upper detecting portion while inhibiting erroneous touch detection by the lower detecting portion when rainwater tends to collect on the lower surface of the door handle when it is raining.

Figure 21:
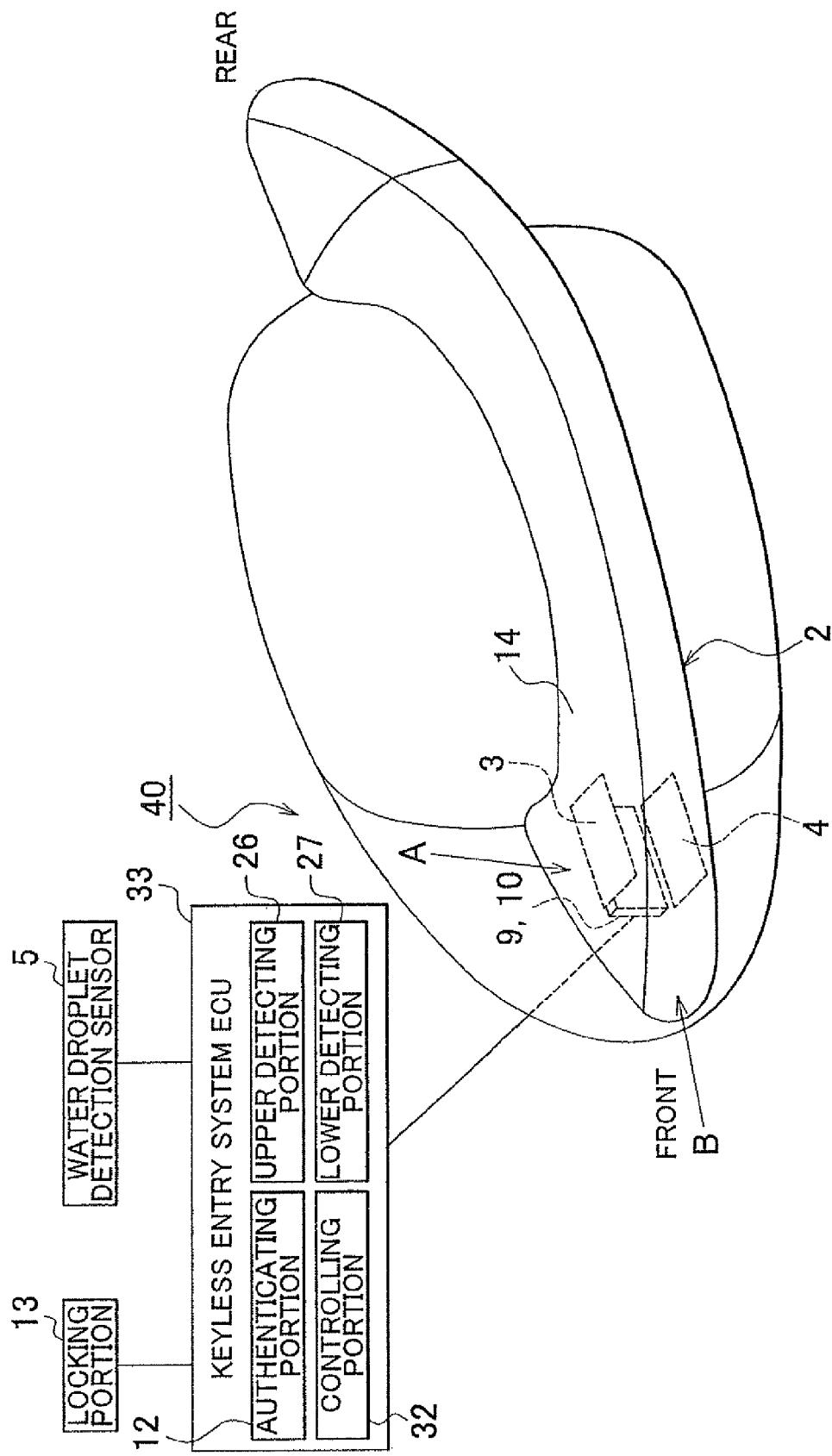
FIG. 21 is a perspective view of a door handle provided with a capacitance touch sensing device according to a seventh example embodiment of the invention.

Next, a capacitance touch sensing device according to a seventh example embodiment of the invention will be described with reference to the drawings. FIG. 21 is a perspective view of a door handle provided with the capacitance touch sensing device according to the seventh example embodiment. The structure that is the same as that in the third example embodiment will be denoted by the same reference numerals, and descriptions thereof will be omitted.

The capacitance touch sensing device 40 according to the seventh example embodiment differs from the capacitance touch sensing device 20 according to the third example embodiment in that a controlling portion 32 is provided instead of the controlling portion 21. The other structure is the same as that in the third example embodiment. The controlling portion 32 is provided in a keyless entry system ECU 33. In this seventh example embodiment, the controlling portion 32 controls the upper detecting portion 26 so that it will not detect contact when the water droplet detection sensor 5 detects that the amount of water droplets on the vehicle body has reached a predetermined amount.

This enables highly sensitive contact detection by the lower detecting portion 27 while inhibiting erroneous detection by the upper detecting portion 26 when there is a possibility that rainwater might collect on the upper surface of a door handle 2.

In the seventh example embodiment, the detection sensitivity of the upper detecting portion 26 is controlled so that it is lower than the detection sensitivity of the lower detecting portion 27 when it is raining. Conversely, in an eighth example embodiment, the detection sensitivity of a lower detecting portion, not shown, is controlled so that it is lower than the detection sensitivity of an upper detecting portion, also not shown, when it is raining. The other structure of the eighth example embodiment is the same as that of the seventh example embodiment.

The eighth example embodiment enables highly sensitive contact detection by the upper detecting portion while inhibiting erroneous touch detection by the lower detecting portion when rainwater tends to collect on the lower surface of the door handle when it is raining.

Figure 22:
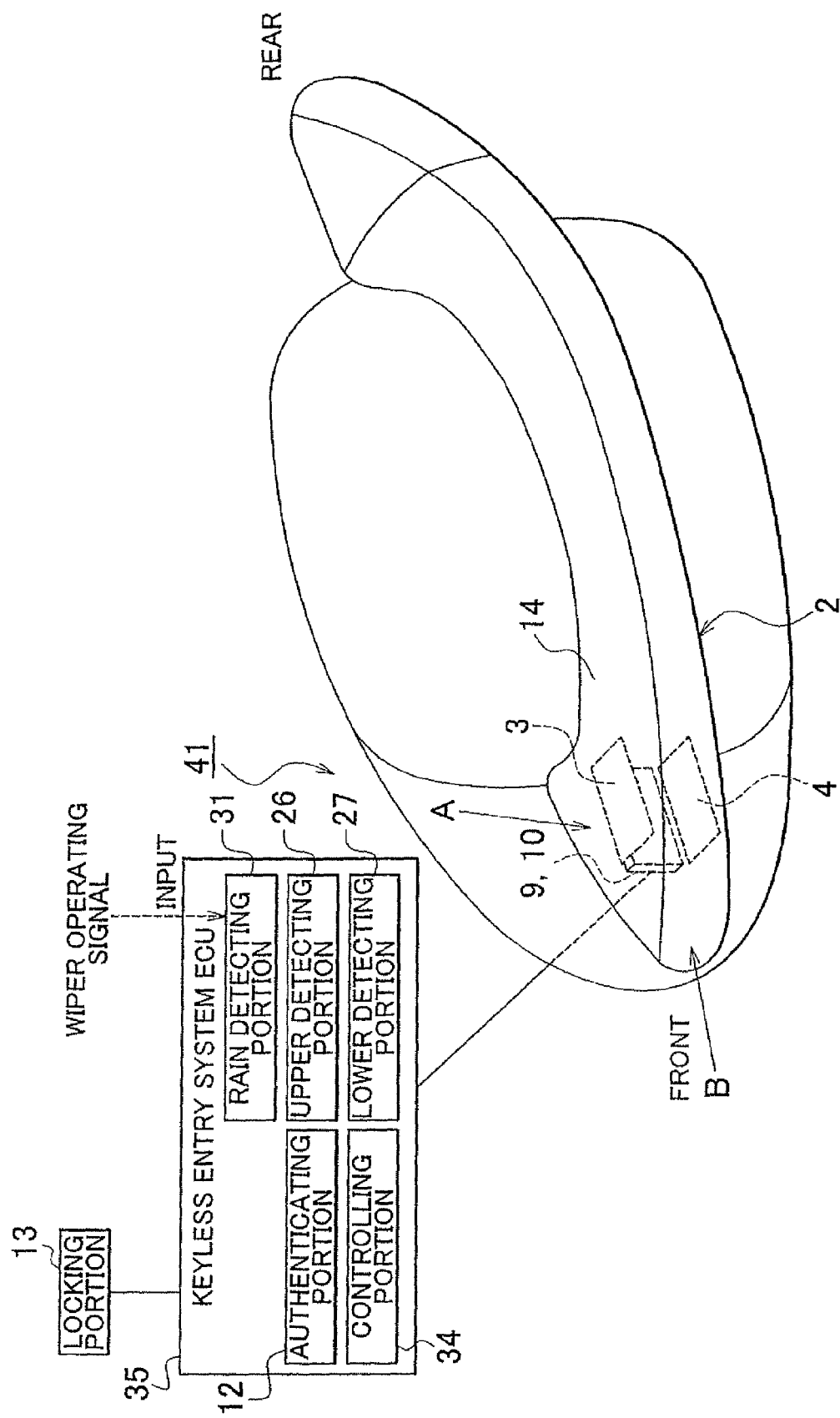
FIG. 22 is a perspective view of a door handle provided with a capacitance touch sensing device according to a ninth example embodiment of the invention.

Next, a capacitance touch sensing device according to a ninth example embodiment of the invention will be described with reference to the drawings. FIG. 22 is a perspective view of a door handle provided with the capacitance touch sensing device according to the ninth example embodiment. The structure that is the same as that in the fifth example embodiment will be denoted by the same reference numerals, and descriptions thereof will be omitted.

The capacitance touch sensing device 41 according to the ninth example embodiment differs from the capacitance touch sensing device 30 according to the fifth example embodiment in that a controlling portion 34 is provided instead of the controlling portion 21. The other structure is the same as that in the fifth example embodiment. The controlling portion 34 is provided in a keyless entry system ECU 35. In this ninth example embodiment, the controlling portion 34 controls the upper detecting portion 26 so that it will not detect contact when the rain detecting portion 31 detects rain.

This enables highly sensitive contact detection by the lower detecting portion 27 while inhibiting erroneous detection by the upper detecting portion 26 when there is a possibility that rainwater might collect on the upper surface of a door handle 2.

In the ninth example embodiment, the detection sensitivity of the upper detecting portion 26 is controlled so that it is lower than the detection sensitivity of the lower detecting portion 27 when it is raining. Conversely, in a tenth example embodiment, the detection sensitivity of a lower detecting portion, not shown, is controlled so that it is lower than the detection sensitivity of an upper detecting portion, also not shown, when it is raining. The other structure of the tenth example embodiment is the same as that of the ninth example embodiment.

The tenth example embodiment enables highly sensitive contact detection by the upper detecting portion while inhibiting erroneous touch detection by the lower detecting portion when rainwater tends to collect on the lower surface of a door handle when it is raining.

Incidentally, in the foregoing description, the capacitance touch sensing devices according to the example embodiments described above are used for locking, though they may also be used for unlocking.

Figure 26:
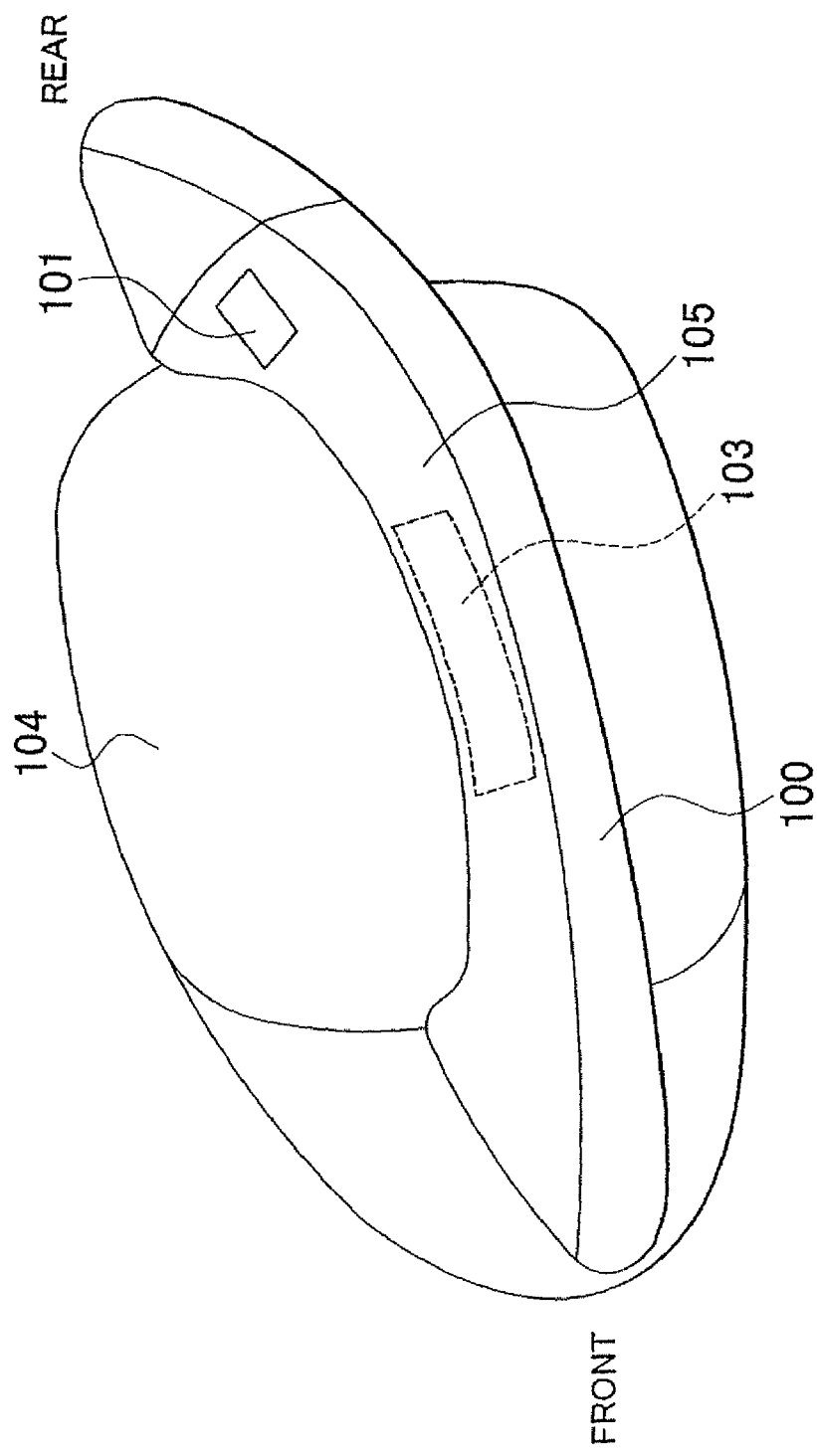
FIG. 26 is a perspective view of an example of a capacitance touch sensing device and a door locking/unlocking device according to related art.

Also, as shown in FIG. 26, in the door handle 100 of the related art, the lock sensor electrode 101 is provided in the rear portion of the door handle 100. Therefore, when the user grabs the handle portion 105 of the door handle 100 to unlock the door, the thumb of the user may accidentally touch the lock sensor electrode 101. This is because it is usual for a person to open and close the right side door with his or her right hand, in which case the thumb of the person when opening and closing the door will be near the rear portion of the door handle 100, and it is usual for a person to open and close the left side door with his or her left hand, in which case the thumb of the person when opening and closing the door will be also near the rear portion of the door handle 100. Also, as shown in FIG. 27, in the door handle 106 of the related art, the lock sensor electrode 102 is provided in the rear portion of the door handle 106. Therefore, when the user grabs the handle portion 105 of the door handle 106 to unlock the door, the thumb of the user may accidentally touch the lock sensor electrode 102.

As a result, even if the user does unlock the door, the door may end up locking again immediately after being unlocked, or the door may end up locking despite the fact that the user is trying to unlock it.

Figure 23:
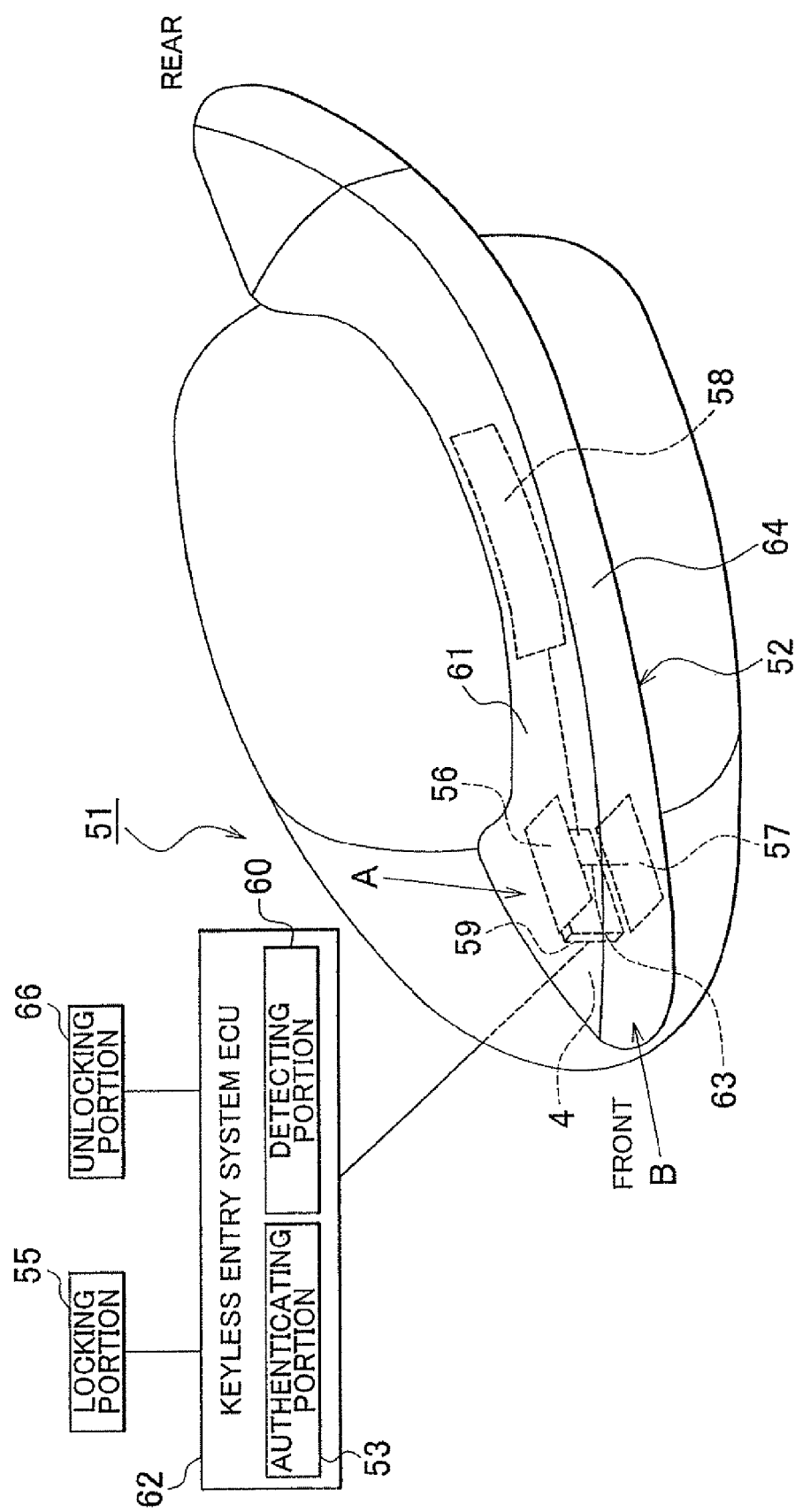
FIG. 23 is a perspective view of a door locking/unlocking device according to an eleventh example embodiment of the invention.
Figure 24:
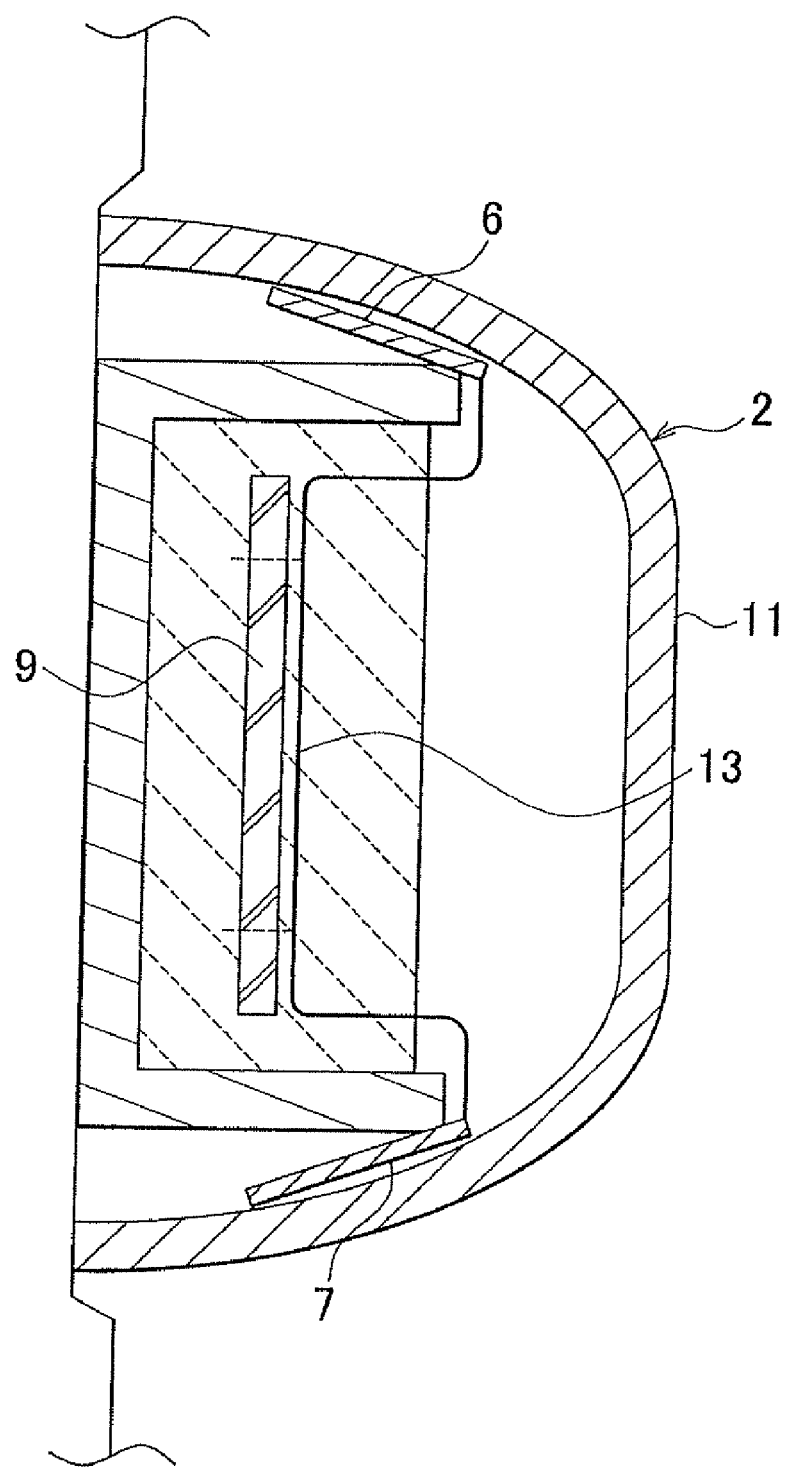
FIG. 24 is a sectional view, as viewed from the direction of arrow XXIV', of a portion of the door handle in FIG. 23 indicated by arrow XXIV, which has been cut in a direction orthogonal to the direction of arrow XXIV'.

Hereinafter, a door locking/unlocking device that locks and unlocks a vehicle door will be described. A door lock/unlock device according to an eleventh example embodiment of the invention will be described with reference to the drawings. FIG. 23 is a perspective view of the door locking/unlocking device according to the eleventh example embodiment, and FIG. 24 is a sectional view, as viewed from the direction of arrow XXIV', of a portion of the door handle in FIG. 23 indicated by arrow XXIV, which has been cut in a direction orthogonal to the direction of arrow XXIV'.

The door locking/unlocking device 51 according to the eleventh example embodiment locks a door when a user touches the upper surface of a door handle 52 outside a vehicle, and unlocks a door when the user touches a backside surface of a handle portion 64 of the door handle 52. The door locking/unlocking device 51 includes an authenticating portion 53, a capacitance touch sensor 54, a locking portion 55, and an unlocking portion 66.

The authenticating portion 53 communicates with a portable device, not shown, carried by the user to authenticate the user outside the vehicle. The user is authenticated (i.e., recognized) by matching a user ID stored in the portable device with a user ID stored in the authenticating portion 53. The authenticating portion 53 is provided in a keyless entry system ECU 62. The authenticating portion 53 communicates with the portable device via a transmitting antenna (not shown) which is provided in the door handle 52, and a receiving antenna (also not shown).

When the user touches at least one of the upper or lower surfaces of the door handle 100 in order to lock the door, the capacitance touch sensor 54 detects that contact. Moreover, when the user touches the backside surface of the handle portion 64 of the door handle 52 in order to unlock the door, the capacitance touch sensor 54 also detects that contact. The capacitance touch sensor 54 includes lock sensor electrodes 56 and 57, an unlock sensor electrode 58, a driving portion 59, and a detecting portion 60. The capacitance touch sensor 54 detects when the user has touched the door handle 52 based on a change in the capacitance when the user (a person) is near the electrode.

The lock sensor electrode 56 is provided in a case 61 of the door handle 52 and is located in a front upper portion of the door handle 52, while the lock sensor electrode 57 is provided in the case 61 of the door handle 52 and is located in a front lower portion of the door handle 52. Both of the lock sensor electrodes 56 and 57 are electrically connected together via a wire 63 which is connected to the driving portion 59. The lock sensor electrode 56 outputs an electrical signal indicative of whether the user has touched the upper surface of the front portion of the door handle 52 to the driving portion 59, and the lock sensor electrode 57 outputs an electrical signal indicative of whether the user has touched the lower surface of the front portion of the door handle 52 to the driving portion 59.

The unlock sensor electrode 58 is provided in a case 61 of the door handle 52 and is located in a backside portion of the handle portion 64 of the door handle 52. The unlock sensor electrode 58 outputs an electrical signal indicative of whether the user has touched the backside surface of the handle portion 64 of the door handle 52 to the driving portion 59.

The driving portion 59 drives the capacitance touch sensor 54 and has a power supply circuit and a resonance circuit, neither of which are shown, which are used for locking. The resonance circuit receives voltage from the power supply circuit and changes the amplitude of the output voltage based on output signals from the lock sensor electrodes 56 and 57. The change in amplitude indicates whether the user has touched at least one of the upper or lower surfaces of the front portion of the door handle 52. The upper driving portion 59 is provided in the case 61 of the door handle 52.

Also, the driving portion 59 has a power supply circuit and a resonance circuit, neither of which are shown, which are used for unlocking. The resonance circuit receives voltage from the power supply circuit and changes the amplitude of the output voltage based on an output signal from the unlock sensor electrode 58. The change in amplitude indicates whether the user has touched the backside surface of the handle portion 64 of the door handle 52.

The detecting portion 60 detects when the user has touched at least one of the upper or lower surfaces of the door handle 52 based on a signal output from the driving portion 59. The detecting portion 60 is provided in the keyless entry system ECU 62. Incidentally, when there is ice or snow on the surface of the door handle 52, the detecting portion 60 may not be able to detect when the user touches the door handle 52 through the ice or snow.

Also, the detecting portion 60 detects when the user has touched the backside surface of the handle 64 of the door handle 52 based on a signal output from the driving portion 59.

The locking portion 55 locks the door when the authenticating portion 53 recognizes the user as a legitimate user and the capacitance touch sensor 54 detects that the user has touched the upper front surface of the door handle 52.

The unlocking portion 66 unlocks the door when the authenticating portion 53 recognizes the user as a legitimate user and the capacitance touch sensor 54 detects that the user has touched the backside surface of the handle portion 64 of the door handle 52.

Figure 25:
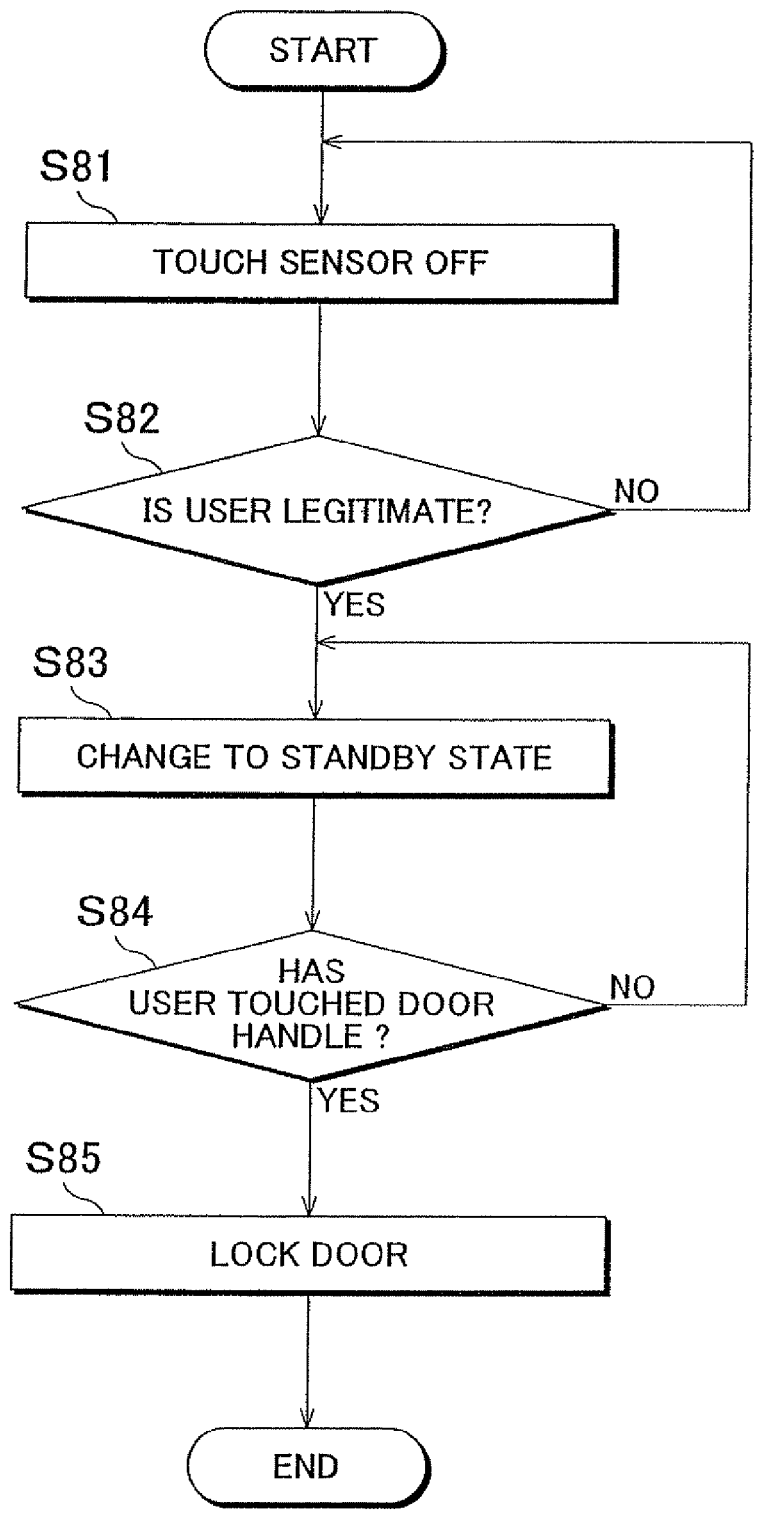
FIG. 25 is a flowchart illustrating operation of the door locking/unlocking device according to the eleventh example embodiment of the invention.

Next, the operation when locking the door locking/unlocking device 51 will be described with reference to FIG. 25. FIG. 25 is a flowchart illustrating operation of the door locking/unlocking device 51. Incidentally, the unlocking operation is not a characteristic of this example embodiment so a description thereof will be omitted.

First, the capacitance touch sensor 54 is off (step S81). Then the user in the vehicle gets out of the vehicle carrying a portable device. At this time, the authenticating portion 53 communicates with the portable device to authenticate the user that is carrying it (step S82). If the authenticating portion 53 recognizes the user as a legitimate user, the keyless entry system ECU 62 changes the capacitance touch sensor 54 from off to a standby state (step S83). This standby state is a state in which, when the user touches the door handle 52, the capacitance touch sensor 54 is able to detect that contact. If, on the other hand, the authenticating portion 53 does not recognize the user as a legitimate user, the keyless entry system ECU 62 keeps the capacitance touch sensor 54 off without changing it to the standby state.

When the user carrying the portable device touches at least one of the upper or lower surfaces of the front portion of the door handle 52 when the capacitance touch sensor 54 is in the standby state, the capacitance between the lock sensor electrodes 56 and 57 changes to a level corresponding to the touch of the user. The detecting portion 60 reads this change in capacitance and determines whether it is due to contact by the user (i.e., the touch of the user) (step S84). If the detecting portion 60 determines that the user touched at least one of the upper or lower surfaces of the front portion of the door handle 52 (i.e., YES in step S84), the locking portion 55 locks the door (step S85). If, on the other hand, the user carrying the portable device does not touch either the upper or the lower surface of the front portion of the door handle 52 within a predetermined period of time after getting out of the vehicle, the detecting portion 60 determines that the user has not touched at least one of the upper or lower surfaces of the front portion of the door handle 52 (i.e., NO in step S84) so it continues to keep the capacitance touch sensor 54 in the standby state. This is the operation of the door locking/unlocking device 51.

As described above, the door locking/unlocking device 51 detects whether the user has touched at least one of the upper or lower surfaces of the door handle 52, and when it is detected that the user has touched at least one of those surfaces, the door locking/unlocking device 51 locks the door. Accordingly, even if there is ice or snow on the upper surface of the door handle 52, the door locking/unlocking device 51 can still reliably lock the door by the user touching the lower surface of the door handle 52 and detecting that contact. Because there is usually no ice or snow on the lower surface of the door handle 52, the door locking/unlocking device 51 is able to reliably lock the door.

Also, the door locking/unlocking device 51 detects when the user has touched the front portion of the door handle 52 so even if the thumb of the user touches the door handle 52 when the user grabs the handle portion 64 to unlock the door, the door locking/unlocking device 51 will not detect that contact as contact with the door handle 52. Accordingly, the door locking/unlocking device 51 will not lock the door when the user is attempting to unlock it.

The invention can be used, for example, as a capacitance touch sensing device that is able to inhibit erroneous detection that a user has touched a door handle when rainwater has collected on an upper surface or the like of the door handle in a vehicle provided with a keyless entry system.

The invention can also be used for, for example, as a capacitance touch sensing device that is able to reliably lock a vehicle door even in a cold climate where ice and snow tend to accumulate on the upper surface of the door handle.

While some embodiments of the invention have been illustrated above, it is to be understood that the invention is not limited to the details of the illustrated embodiments, but may be embodied with various changes, modifications or improvements, which may occur to those skilled in the art, without departing from the spirit and scope of the invention.

The invention claimed is:

1. A capacitance touch sensing device arranged to detect the touch of a user against a surface of a door handle on the outside of a vehicle, comprising:
    an upper sensor electrode that is provided on an upper portion of the door handle and arranged to output a signal based on a change in capacitance near the upper sensor electrode;
    a lower sensor electrode that is provided on a lower portion of the door handle and arranged to output a signal based on a change in capacitance near the lower sensor electrode;
    an upper detecting portion that detects when the user has touched an upper surface of the door handle based on the output from the upper sensor electrode;
    a lower detecting portion that detects when the user has touched a lower surface of the door handle based on the output from the lower sensor electrode; and
    a rain detecting unit that detects rain,
    wherein a detection sensitivity of one of the upper detecting portion or the lower detecting portion is lower than the detection sensitivity of the other, and
    wherein the rain detecting unit is located away from a door.

2. The capacitance touch sensing device according to claim 1, wherein the detection sensitivity of the upper detecting portion is lower than the detection sensitivity of the lower detecting portion.

3. The capacitance touch sensing device according to claim 1, further comprising:
    a controlling portion which, when the rain detecting unit detects rain, reduces the detection sensitivity of one of the upper detecting portion or the lower detecting portion so as to be lower than the detection sensitivity of the other.

4. The capacitance touch sensing device according to claim 3, wherein when the rain detecting unit detects rain, the controlling portion reduces the detection sensitivity of the upper detecting portion so as to be lower than the detection sensitivity of the lower detecting portion.

5. The capacitance touch sensing device according to claim 4, wherein the controlling portion sets the detection sensitivity of the upper detecting portion to zero when the rain detecting unit detects rain.

6. The capacitance touch sensing device according to claim 3, wherein the rain detecting means is a water droplet detection sensor that detects an amount of water droplets on a vehicle body.

7. The capacitance touch sensing device according to claim 6, wherein the controlling portion changes the amount by which the detection sensitivity is reduced according to the amount of water droplets on the vehicle body.

8. The capacitance touch sensing device according to claim 6, wherein the controlling portion gradually increases the amount by which the detection sensitivity is reduced as the amount of water droplets on the vehicle body increases.

9. The capacitance touch sensing device according to claim 3, wherein the rain detecting unit detects rain based on operation of a wiper.

10. The capacitance touch sensing device according to claim 9, wherein the controlling portion changes the amount by which the detection sensitivity is reduced according to the operating state of the wiper.

11. The capacitance touch sensing device according to claim 9, wherein the controlling portion gradually increases the amount by which the detection sensitivity is reduced as the operation of the wiper becomes faster.

12. The capacitance touch sensing device according to claim 3, wherein the controlling portion sets the detection sensitivity of one of the upper detecting portion or the lower detecting portion to zero when the rain detecting unit detects rain.

13. The capacitance touch sensing device according to claim 1, wherein the upper portion of the door handle is an upper portion in the vertical direction when the door handle is attached to the vehicle, and the lower portion of the door handle is a lower portion in the vertical direction when the door handle is attached to the vehicle.

14. A door locking device which locks and unlocks a door in response to the touch of a user against a surface of a door handle on the outside of a vehicle, comprising:
- an authenticating portion which communicates with a portable device carried by the user to authenticate the user outside the vehicle;
- the capacitance touch sensing device according to claim 1; and
- a locking portion which locks or unlocks the door when the authenticating portion recognizes the user as a legitimate user and the capacitance touch sensing device detects the touch of the user.

15. The door locking device according to claim 14, wherein the locking portion locks the door when the authenticating portion recognizes the user as a legitimate user and the capacitance touch sensing device detects the touch of the user.

16. The capacitance touch sensing device according to claim 1, wherein the lower sensor electrode is provided on a bottom of the door handle.

* * * * *